(12) United States Patent
Toda

(10) Patent No.: US 8,004,873 B2
(45) Date of Patent: Aug. 23, 2011

(54) RESISTANCE CHANGE MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 12/389,606

(22) Filed: Feb. 20, 2009

(65) Prior Publication Data

US 2009/0213639 A1   Aug. 27, 2009

(30) Foreign Application Priority Data

Feb. 25, 2008 (JP) ................................ 2008-042348

(51) Int. Cl.
*G11C 11/00* (2006.01)
(52) U.S. Cl. .................. 365/148; 365/175; 365/158
(58) Field of Classification Search .................. 365/148, 365/158, 175
See application file for complete search history.

(56) References Cited

U.S. PATENT DOCUMENTS

| | | | |
|---|---|---|---|
| 6,788,568 B2 * | 9/2004 | Hidaka | 365/158 |
| 6,914,806 B2 * | 7/2005 | Kunikiyo | 365/158 |
| 7,102,922 B2 * | 9/2006 | Hidaka | 365/158 |
| 7,209,380 B2 * | 4/2007 | Ezaki et al. | 365/158 |
| 7,535,748 B2 * | 5/2009 | Shirahama et al. | 365/148 |
| 7,733,692 B2 * | 6/2010 | Hidaka | 365/171 |
| 2007/0047323 A1 | 3/2007 | Murooka et al. | |
| 2007/0285965 A1 | 12/2007 | Toda et al. | |
| 2008/0068875 A1 | 3/2008 | Choi | |
| 2010/0054019 A1 | 3/2010 | Toda | |
| 2010/0162068 A1 | 6/2010 | Toda | |
| 2010/0235714 A1 | 9/2010 | Toda | |
| 2011/0051492 A1 | 3/2011 | Toda | |

\* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

A resistance change memory device including a memory cell array with first wirings, second wirings, and memory cells, the memory cell including a diode and a variable resistance element, anode of diodes being located on the first wiring side, wherein the memory cell array is sequentially set in the following three states after power-on: a waiting state defined by that both the first and second wirings are set at a first voltage; a standby state defined by that the first wirings are kept at the first voltage and the second wirings are set at a second voltage higher than the first voltage; and an access state defined by that a selected first wiring and a selected second wiring are set at a third voltage higher than the first voltage and the first voltage, respectively.

9 Claims, 21 Drawing Sheets read(other WL/BL)

standby read

FIG. 33

| Cell | 0 | | 1 | |
|---|---|---|---|---|
| | imoni Level | switch State | imoni Level | switch State |
| initial | H | on | L | on |
| prog. completion | L (current decrease) | off | H (current increase) | off |

RESISTANCE CHANGE MEMORY DEVICE

CROSS-REFERENCE TO RELATED APPLICATION

This application is based on and claims the benefit of priority from the prior Japanese Patent Application No. 2008-042348, filed on Feb. 25, 2008, the entire contents of which are incorporated herein by reference.

BACKGROUND OF THE INVENTION

1. Field of the Invention

This invention relates to a resistance change memory device with a memory cell for storing a resistance state of a variable resistance element in a non-volatile manner, specifically to a technique for measuring against defective memory cells.

2. Description of the Related Art

A resistance change memory device (resistance RAM: ReRAM) has been proposed to store a resistance value as data, which is reversibly exchanged by applying voltage, current or heat, and it is noticed for succeeding to the conventional flash memory. This ReRAM is suitable for shrinking the cell size, and for constituting a cross-point cell array. In addition, it is easy to stack cell arrays.

Especially, a unipolar type of ReRAM is settable in a high resistance state or a low resistance state by controlling the applied voltage value and applying time (for example, Y. Hosoi et al, "High Speed Unipolar Switching Resistance RAM(RRAM) Technology" IEEE International Electron Devices Meeting 2006 Technical Digest p. 793-796).

However, there is such a probability in ReRAM that as the high integration progresses, the number of defective cells increases. It is usually used a diode as an access element of a ReRAM's memory cell, and cell selection is performed by use of the difference between the forward-bias state and the reverse-bias state. In this case, if cell leak is generated at a cross point cell, there is a probability that the cell bias may be reversed in other cells coupled to a word line or a bit line coupled to the defective cross point cell. Therefore, the influence of the defective cell is large. Specifically, this becomes a large problem in case of achieving a large capacitive ReRAM with a three dimensional (3-D) cell array structure.

SUMMARY OF THE INVENTION

According to an aspect of the present invention, there is provided a resistance change memory device including: a memory cell array, which includes a plurality of first wirings, a plurality of second wirings so disposed as to cross the first wirings, and memory cells disposed at the cross points of the first and second wirings, the memory cell including a diode and a variable resistance element connected in series, the diode being disposed with such a polarity that anode thereof is located on the first wiring side, wherein the memory cell array is sequentially set in the following three states after power-on: a waiting state defined by that both the first and second wirings are set at a first voltage; a standby state defined by that the first wirings are kept at the first voltage and the second wirings are set at a second voltage higher than the first voltage; and an access state defined by that a selected first wiring and a selected second wiring are set at a third voltage higher than the first voltage and the first voltage, respectively, a selected memory cell being read or written in the access state.

According to another aspect of the present invention, there is provided a resistance change memory device including:

a memory cell array, which includes a plurality of first wirings, a plurality of second wirings so disposed as to cross the first wirings, and memory cells disposed at the cross points of the first and second wirings, the memory cell including a diode and a variable resistance element connected in series, the diode being disposed with such a polarity that anode thereof is located on the first wiring side; and a defect detection circuit configured to detect a defective second wiring, to which a defective cell with a degraded diode is coupled, in such a standby state of the memory cell array that the diodes of the memory cells are reverse-biased, and set the defective second wiring in a floating and unused state.

BRIEF DESCRIPTION OF THE DRAWINGS

FIG. 33 is a diagram for explaining the operation of the current cutter circuit.

DETAILED DESCRIPTION OF THE EMBODIMENTS

Illustrative embodiments of this invention will be explained with reference to the accompanying drawings below.

[3-D Cell Array]

Figure 1:
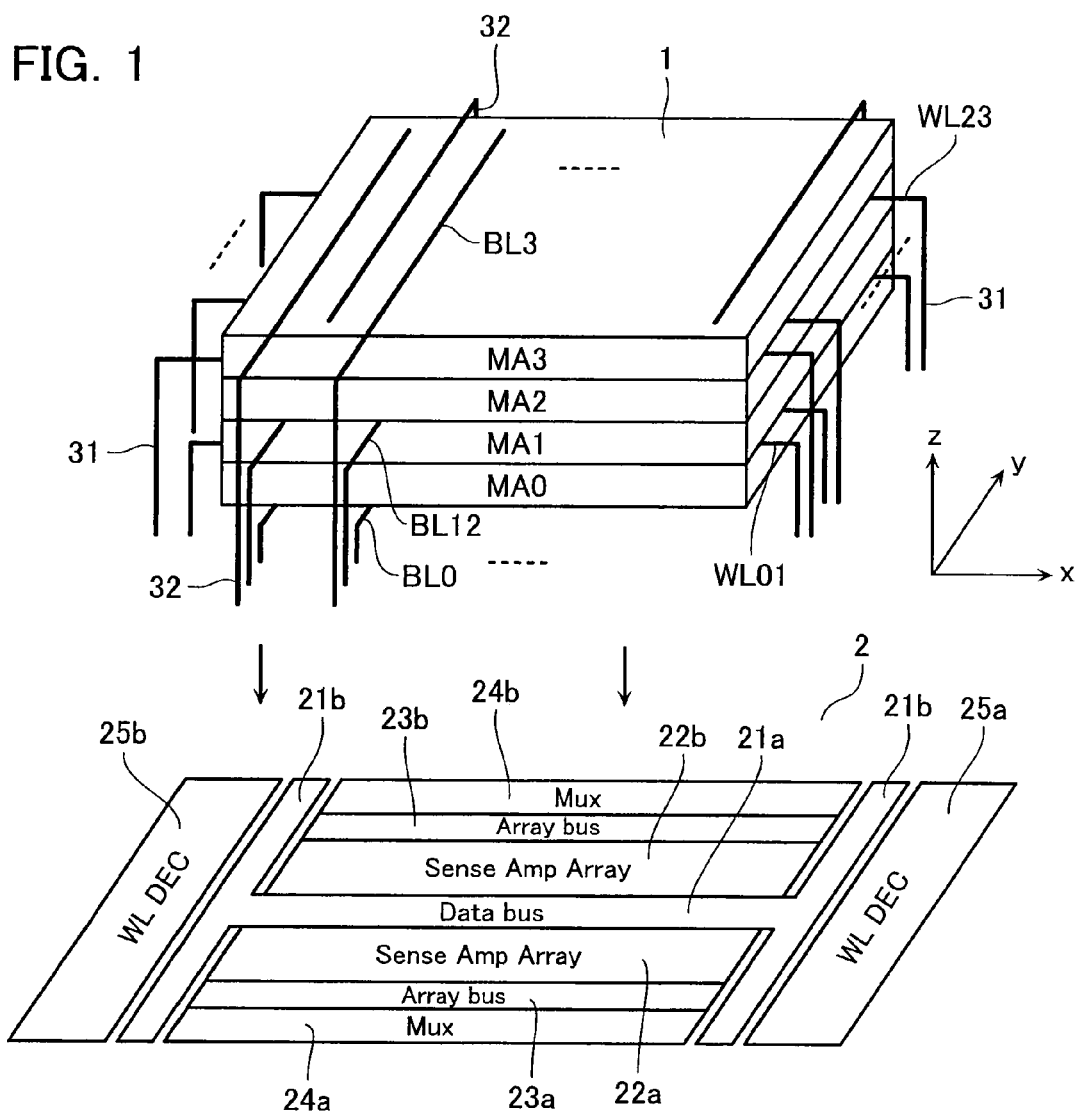
FIG. 1 shows a 3D cell array in accordance with an embodiment of the present invention.

FIG. 1 is a perspective view of a schematic three-dimensional (3-D) cell array block 1 and read/write circuit 2 formed on the underlying semiconductor substrate in a ReRAM in accordance with an embodiment. Although there is shown here only one cell array block 1, multiple cell array blocks will be arranged in practice in a matrix manner.

Figure 2:
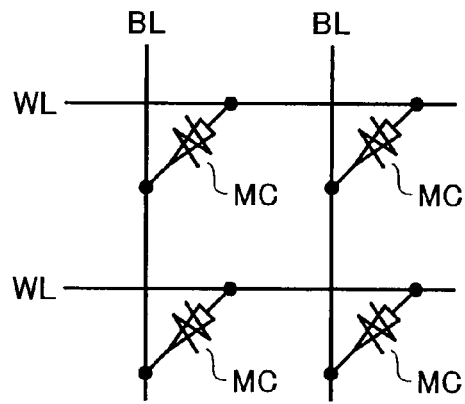
FIG. 2 shows an equivalent circuit of a cell array layer of the 3D cell array.

The cell array block 1 is formed of, for example, four cell arrays MA0-MA3. Each cell array is, as shown in FIG. 2, formed of multiple first wirings (referred to as word lines, hereinafter) WL, multiple second wirings (referred to as bit lines, hereinafter) BL so disposed as to cross the word lines WL and memory cells MC disposed at the respective cross points of the word lines WL and bit lines BL.

Figure 3:
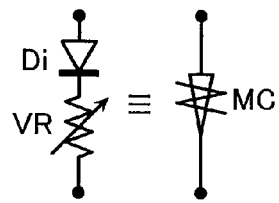
FIG. 3 shows the memory cell symbol.

Memory cell MC is, as shown in FIG. 3, formed of a variable resistance element VR and a diode Di connected in series. In this example, diode Di is disposed with such a polarity that anode thereof is located on the word line side. However, it should be noted it is useful such a polarity that the cathode of diode Di is located on the word line side.

In the cell array block 1 shown in FIG. 1, adjacent cell arrays share bit lines BL and word lines WL. That is, first cell array MA0 and second cell array MA0 share word lines WL01, third cell array MA2 and fourth cell array MA3 share word lines WL23. As similar to this, second cell array MA1 and third cell array MA2 share bit lines BL12. Bit lines BL0 of the first cell array MA0 and bit lines BL3 of the fourth cell array MA3 are disposed independently because these have no partners to be shared. However, bit lines BL0 and BL3 may be coupled to each other as common bit lines BL03 because these are not used simultaneously.

Read/write circuit 2 has two sense amplifier arrays 22a and 22b arranged in the bit line direction of the cell array block 1. Bit lines BL are drawn through vertical via-wirings 32 disposed on the both ends of the bit lines BL to be coupled to bit line selecting circuits (decoder/multiplexers) 24a and 24b, and selected bit lines BL are coupled to the sense amplifier arrays 22a and 22b via array buses 23a and 23b. Disposed between the sense amplifier arrays 22a and 22b is data bus 21a.

Data bus 21a is coupled to data buses 21b disposed on the both ends of data bus 21a, which are disposed to cross the data bus 21a. Word line decoder/multiplexers 25a and 25b are disposed outside of the data buses 21b. Word lines WL are drawn through vertical via-wirings 31 disposed on the both ends of the word lines WL to be coupled to word line decoder/multiplexers 25a and 25b.

In the following explanation, it is assumed that a high resistance state (i.e., a stable state) of the variable resistance element is defined as data "0"; and a low resistance state obtained by applying voltage to the "0" data cell is defined as data "1". Applying voltage to a data "1" cell, a large current flows as a result of Joule's heat, so that the cell is reset to be in the data "0" state.

The details of read/write circuit 2 will be explained later.

[Method of Setting Memory Cell Selection States]

Figure 4:
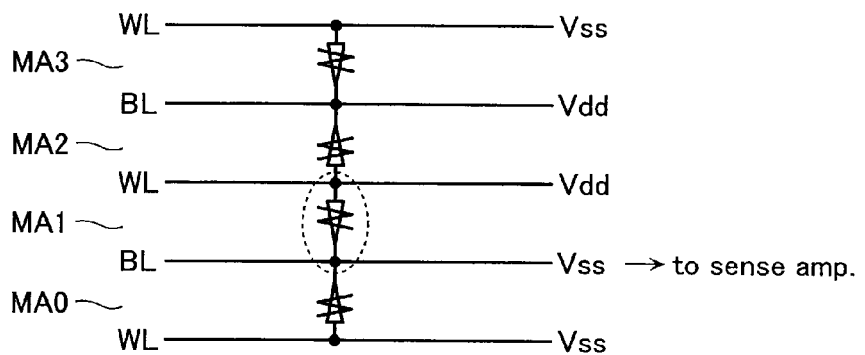
FIG. 4 shows the cell selection method of the 3D cell array in the stacking direction.
Figure 5:
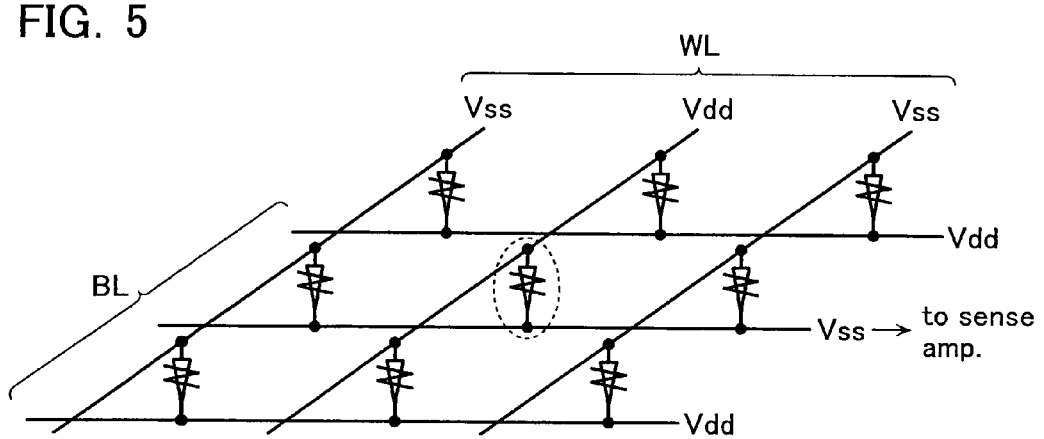
FIG. 5 shows the cell selection method of the 3D cell array in a cell array layer.

A method of setting memory cell selection state in the ReRAM with the 3-D cell array structure will be explained in detail with reference to FIGS. 4 and 5. FIG. 4 shows the relationships between cell array layers while FIG. 5 shows the relationships in a cell array layer.

As described above, both bit line BL and word line WL are shared by adjacent two cell arrays. To select one cell surrounded by a dotted line, word line WL and bit line WL, to which the selected cell belongs, are set at a relatively high level voltage (e.g., power supply voltage) Vdd and a low voltage (e.g., ground potential) Vss, respectively. Unselected word lines are set at Vss while unselected bit lines are set at Vdd.

As a result, diode Di is forward-biased only in the selected cell disposed at the cross point of the selected word line and the selected bit line, so that cell current will be carried from the selected word line WL to the selected bit line BL in accordance with the cell's resistance state. There is not carried cell current in the unselected cells because diodes in the unselected cells are reverse-biased or set in a zero-bias state (i.e., voltage between anode and cathode is zero). This relationship between the selected cell and unselected cell can be said not only in case the selected cell and unselected cell are disposed in different layers but also these are within a layer.

Detect the cell current of the selected cell with a sense amplifier, and the cell's resistance state, i.e., cell data will be read. Further, apply voltage or current to the selected cell's variable resistance element via the diode, and monitor the cell current variation state with a sense system, and the resistance state, i.e., cell data will be written.

Since cell current is referred to as cell information in not only "read" operation but also "write" operation, the successive explanations will be performed typically for the "read state". Here, a high level voltage used at a read time, Vdd (read), and a high level voltage used at a write time, Vdd (write), are set generally in the relationship of: Vdd(read) <Vread(write), so that the read operation does not bring the resistance state to be varied even if cell voltage or cell current is applied. Therefore, cell data disturbance occurs when an unexpected cell is applied with undesired voltage or current at a write time.

[Bad Cell and Influence Thereof]

As the memory capacity becomes large and the number of cells becomes large, it can not be avoided that defective or bad cells are generated in the cell array. Specifically, it is difficult to form diodes uniformly with a good property because diodes are formed of a polysilicon layer, and it is not avoided that some diodes have a degraded reverse breakdown voltage property. Further, as the cell integration progresses, the fluctuation of the impurity concentration is generated in the diodes, so that some diodes have an extremely degraded breakdown voltage property with a certain probability.

In case there is a bad cell, in which cell current flow not a little in a reverse-biased state, the bad cell's influence to other cells will be explained below for some cell array states.

(In Case there is Only One Bad Cell in a Cell Array)

Figure 6:
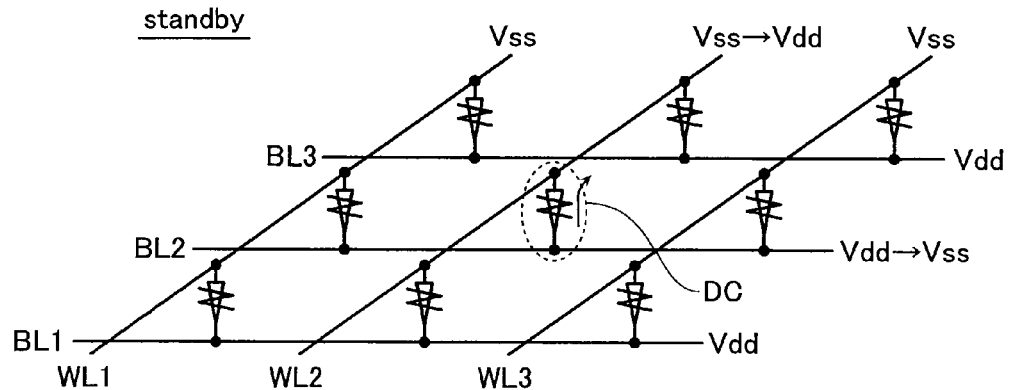
FIG. 6 is a diagram for explaining an influence of a bad cell in the cell array at a standby time.
Figure 7:
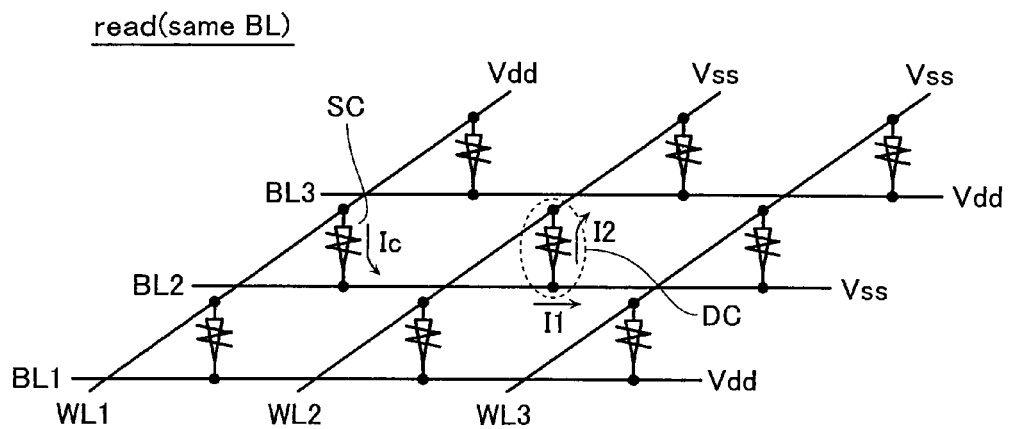
FIG. 7 is a diagram for explaining an influence of a bad cell in the cell array at a read time.
Figure 8:
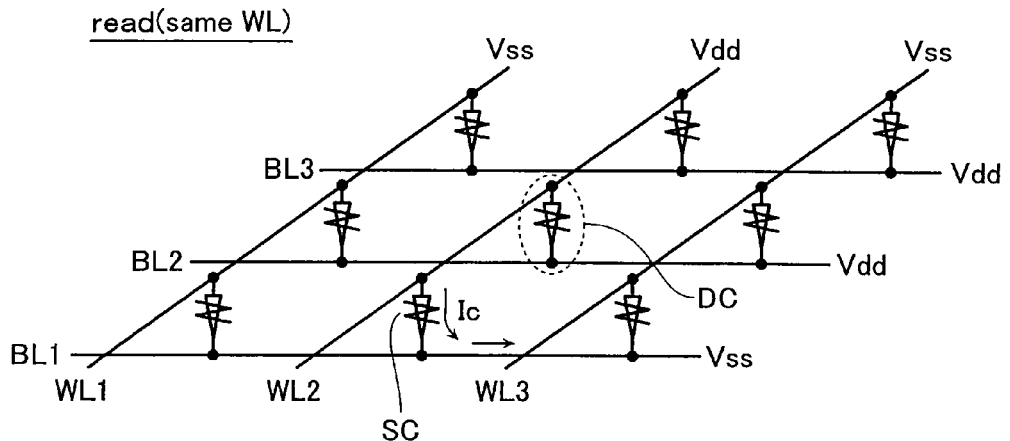
FIG. 8 is a diagram for explaining another influence of a bad cell in the cell array at a read time.

FIGS. 6 to 8 are diagrams for explaining the influence of the leak current in a standby state and a read state with respect to such a case that there is only one bad cell in a cell array. In these diagrams, cell DC surrounded by a dotted line is a "defective cell" or a "bad cell", in which the diode has a degraded breakdown voltage.

In the standby state, as shown in FIG. 6, word lines WL are set at Vss while bit lines BL are set at Vdd so that the diodes are reverse-biased in all cells. At this time, leak current flows in the bad cell DC from bit line BL2 to word line WL2. As a result, word line WL2 and bit line BL2, to which the bad cell DC belongs, will be changed in potential from Vss toward Vdd and from Vdd toward Vss, respectively, and these come to a medium potential between Vss and Vdd.

These voltage changes of word line WL2 and bit line BL2, to which bad cell DC is coupled, do not make the diodes in other cells forward-biased. Therefore, there is no disturbance in other cells. This is the same in a write standby state with Vdd set at Vdd(write).

Next, the influence of bad cell DC in a read state of a selected cell will be examined. In detail, this is such a read state that a certain cell excepting bad cell DC is selected on the bit line BL2, to which bad cell DC is coupled (i.e., such a case that there is considered to have the largest influence).

FIG. 7 shows a read state case, in which selected cell SC is on the same bit line BL2 as that of bad cell DC, i.e., selected cell SC is coupled to word line WL1 here. At this read access time, the selected cell's current obtained in case selected word line WL1 is set at Vdd and selected bit line BL2 is set at Vss is the only cell information. Therefore, if there is bad cell DC on the same bit line BL2, current I2 flowing on the word line WL2 via bad cell DC is added to current I1 flowing toward the sense amplifier via selected bit line BL2 because word line WL2, to which bad cell DC belongs, is unselected and set at Vss.

This situation means that in case selected cell SC is in the low resistance state, i.e., data "1" state, part of the cell current Ic leak out via bad cell DC without flowing into the sense amplifier. In other words, the cell current taken in the sense amplifier is reduced, i.e., the read margin of data "1" is reduced, thereby making the possibility of erroneous read high.

In case of data writing, since the leak current is added to the cell current corresponding to data "1" in the sense amplifier system, additional current flows in the selected cell, which has been set at the low resistance state. That is, Additional Joule's heat is generated in the selected cell, and the fluctuation of the cell's resistance state will increase. In case of writing the high resistance state, i.e., data "0", current may be monitored as being lowered on the bit line BL2 even if the selected cell has not reached a sufficiently high resistance state, so that there is a probability that the selected cell ends in an insufficiently high resistance state. There is no disturbance with respect to other cells.

Next, the influence in such a case that cell SC is selected on the same word line WL2 as that of bad cell DC will be explained with reference to FIG. 8. If bad cell DC is on a selected word line, the bit line BL2, to which bad cell DC belongs, is set at Vdd. Therefore, cell current does not flow in bad cell DC, so that there is no influence for other cells. In other words, other cells excepting the bad cell DC on the word line WL2, to which bad cell DC is coupled, may be read normally as if there is not a defective cell.

In case of cell data writing, the situation is as well as that at a read time except that Vdd(write) higher than Vdd(read) is used.

(In Case there are Two Bad Cells in a Cell Array)

Figure 9:
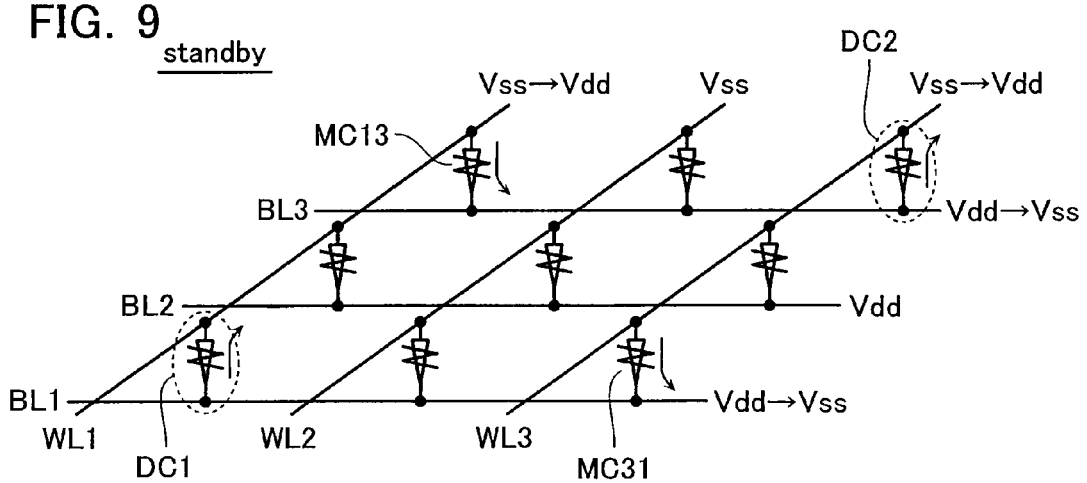
FIG. 9 is a diagram for explaining an influence of two bad cells in the cell array at a standby time.
Figure 10:
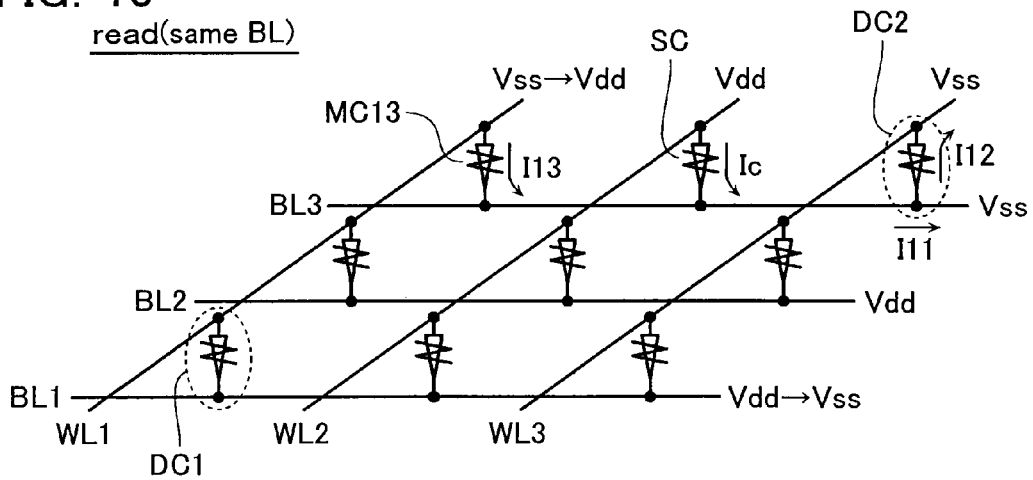
FIG. 10 is a diagram for explaining an influence of two bad cells in the cell array at a read time.
Figure 11:
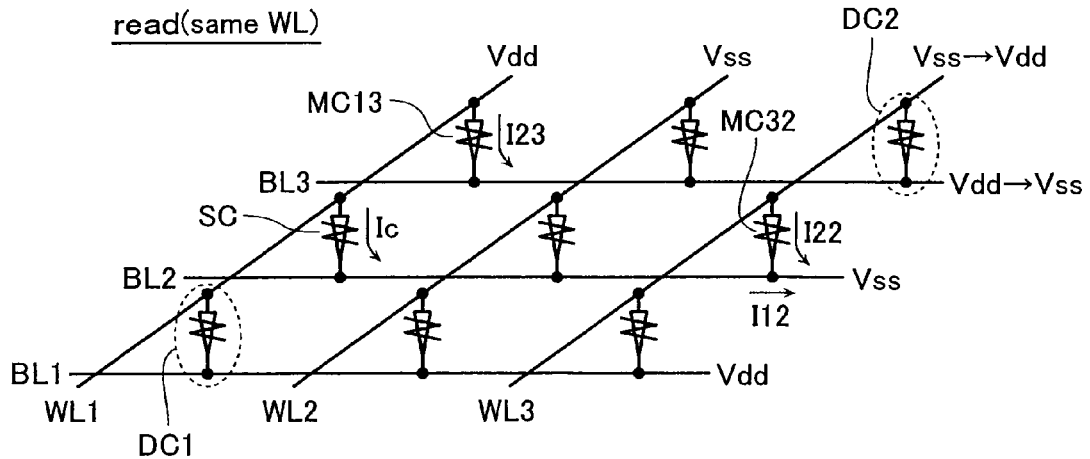
FIG. 11 is a diagram for explaining another influence of two bad cells in the cell array at a read time.

FIGS. 9 to 11 are diagrams for explaining the influence of the leak current in a standby state and a read state with respect to such a case that there are two bad cells in a cell array. Here, it is assumed that two bad cells are independent of each other, i.e., these do not share a word line or a bit line.

Although FIGS. 9 to 11 show such a case that there are two independent bad cells DC1 and DC2, this is generalized into such a case that the number of independent bad cells is "n". Note here, in case multiple bad cells are disposed on a word line or a bit line, it appears the same as a case that there is one cell with a large leakage current. Therefore, the situation will be guessed from the above-described examination result.

In the standby state shown in FIG. 9, word lines WL1 and WL3 and bit lines BL1 and BL3, to which bad cells DC1 and DC2 are coupled, are set at a medium potential between Vss and Vdd. Therefore, there is a probability that cross-point cells MC13 and MC31 of these word lines WL1, WL3 and bit lines BL1, BL3 may be disturbed because diodes thereof are forward-biased in accordance with the medium potential value.

The number of cells which may be disturbed is 2 in case the number of the independent bad cells is 2 as shown in FIG. 9. In general, in case the number of the independent bad cells is "n", each bad cell has (n−1) cells to be disturbed, so that the total number of cells with a probability of the disturbance becomes n(n−1).

Here, "disturbance" is defined by a state that a data state becomes to have little margin as a result of the cell resistance change, or another state that cell data is inverted. What is problematic is in a case that Vdd is set at relatively high Vdd(write) at a data write time. In case of reading, relatively low power supply voltage Vdd(read) may be used, there is not so problematic.

FIG. 10 shows a read state that cell SC is selected on the bit line BL3 with bad cell DC2 coupled. In the read mode of this selected cell SC, current I12 of the bad cell DC2 is added to cell current I11 to be taken into the sense amplifier. Additionally, since word line WL1, to which another bad cell DC1 is coupled, is set at a medium level between Vdd and Vss, the diode in the cell MC13 disposed between word line WL1 and bit line BL3 is forward-biased, so that current I13 flows into the selected bit line BL3.

Therefore, in a data write mode, there is a probability that unselected cell MC13 is disturbed. Additionally, current I11 to be detected by the sense amplifier as cell current Ic of the selected cell SC becomes meaningless because additional current I13 flows from unselected cell MC13. Therefore, there is a large probability that erroneous read or erroneous write occurs.

With respect to cells with no relation to the read operation, the situation of the word line and bit line is the same as in the standby state. Therefore, the cross-point cell between a word line and a bit line, to which a bad cell is coupled, may be disturbed.

FIG. 11 shows a read state that a cell SC is selected on the word line WL1, to which bad cell DC is coupled. At this time, there is not additional current via the bad cell to be added to the current I12 to be taken in the sense amplifier from the selected cell SC via bit line BL2. However, since word line WL3, to which another bad cell DC2 is coupled, is set at a medium potential between Vss and Vdd, the diode in the unselected cell MC32, which is disposed between word line WL3 and the selected bit line BL2, is forward-biased, so that current I22 flows into the selected bit line BL2.

As a result, there is a probability that unselected cell MC32 is disturbed at a write time. Additionally, current I12 to be detected as cell current Ic of the selected cell SC in the sense amplifier at a read time appears larger due to the injected current I22. Therefore, in case the selected cell SC is in the high resistance state of data "0", the cell current is detected to be larger than the true value. As a result, there is a large possibility that a "0" data read error is generated.

In a case that the selected cell SC is written, the cell current will be monitored as large one in spite of that the substantial cell current is small. Therefore, there is a probability that the selected cell ends in an insufficiently low resistance state in case of data "1" write. In case of data "0" write, write completion may not be judged due to the leakage current in spite of that the selected cell has become the high resistance state. As a result of that cell voltage is applied in too long time, the fluctuation of cell data state becomes large.

Additionally, since the bit line BL3, to which another bad cell DC2 is coupled, is set at a medium potential between Vss and Vdd, the diode in unselected cell MC13 disposed between the bit line BL3 and the selected word line WL1 is forward-biased, so that the unselected cell MC13 may be disturbed at a write time with Vdd(write) used. Note here that in case there are numerous independent bad cells, word line WL and bit line BL of a cell with no relation to the read operation are set at the same state as that in the standby state. Therefore, there is a probability that the cross-point cell between the word line WL and bit line BL may be disturbed.

[Measures Against Bad Cell]

Next, it will be explained methods for limiting the influence of bad cells and effectively using the cell array including the bad cell. First, to strongly drive a word line, it is required of the word line decoder to have a low output impedance for setting Vss and Vdd. Second, the bit line, to which a bad cell is coupled, is dealt as a "bad bit line" which is not driven and set in a floating and unused state. If these setting are made to be possible, it becomes possible to reduce the influence of the bad cell. The details will be explained below.

Figure 12:
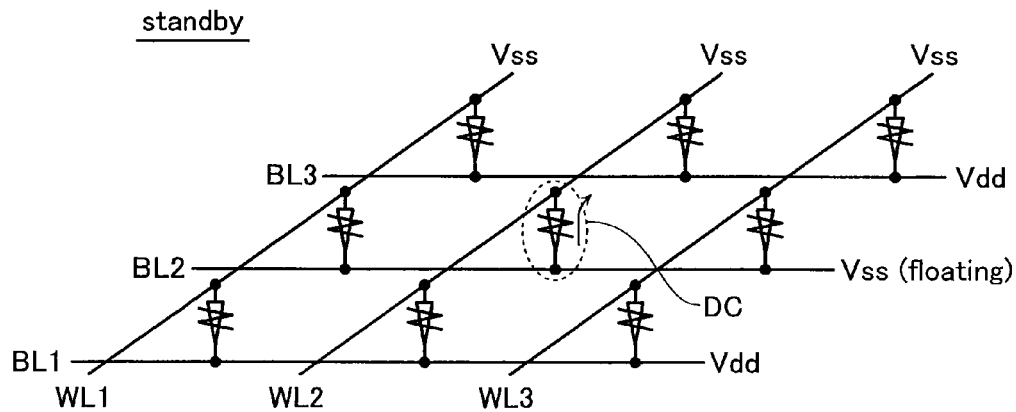
FIG. 12 is a diagram for explaining an influence in the cell array at a standby time in case a bad bit line is set in a floating state.
Figure 13:
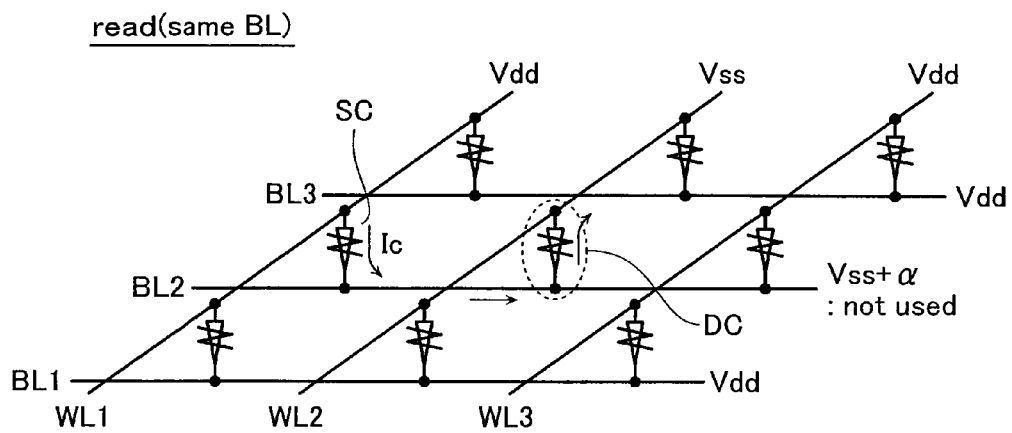
FIG. 13 is a diagram for explaining an influence in the cell array at a read time in case a bad bit line is set in a floating state.
Figure 14:
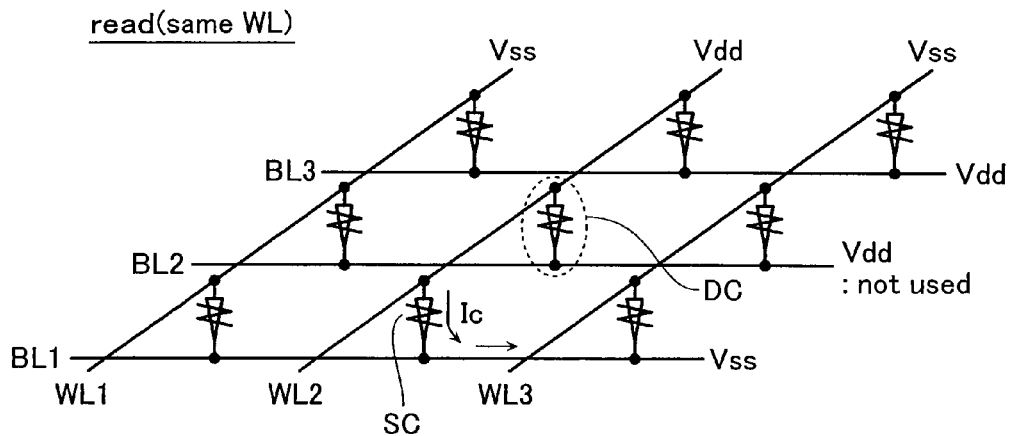
FIG. 14 is a diagram for explaining another influence in the cell array at a read time in case a bad bit line is set in a floating state.

FIGS. 12 to 14 show situations in the respective operation states, in each of which there is a bad cell in a cell array, and the bad bit line is set in a floating state.

In FIGS. 12 to 14, bad cell DC is one coupled between word line WL2 and bit line BL2.

FIG. 12 shows such a standby state that all word lines are set at Vss while all bit lines are set at Vdd, but bit line (i.e., bad bit line) BL2, to which bad cell DC is coupled, is set to be floating. In this case, the bit line BL2 is reduced in level to be set at Vss of word line WL2 via reverse-biased bad cell DC. However, even if bad bit line BL2 is set at Vss, cell diodes coupled to word lines WL set at Vss are not forward-biased. Therefore, the influence of the bad cell DC will be not generated anywhere.

FIG. 13 shows a case that bad bit line BL2 is selected. Explaining in detail more, this is an access state that bad bit line BL2 and word line WL1 which is not coupled to a bad cell are selected. Although, cells on the bad bit line BL2 are not accessed because bad bit line BL2 is set to be floating and not used, the influence of leakage current in this access mode will be examined here.

When the selected word line WL1 is set at Vdd, a current path is formed from word line WL1 to word line WL2, which is coupled to bad cell DC and set at Vss, via the selected cell SC and bad bit line BL2. As a result, the floating bad bit line BL2 is boosted to Vss+α.

Other cells except selected cell SC and bad cell DC are in the reverse-biased state, so that the selected cell SC to be subjected to data read with Vdd(read) is not disturbed. If selected cell SC is selected for data writing with Vdd(write), it will be disturbed. However, this selected cell SC is on the bad bit line BL2 and not used in practice. Therefore, there is no problem except that additional access current flows.

FIG. 14 shows another access state that word line WL2 and bit line BL1 are selected. In this case, word line WL2 is coupled to bad cell DC while bit line BL1 is not coupled to bad cell DC. Bad bit line BL2 set to be floating will be charged up to Vdd from the selected word line WL2 applied with Vdd via bad cell DC. Therefore, other cells except bad cell DC on the bad bit line BL2 are reverse-biased. The selected cell SC is normally read or written.

Next, it will be explained with reference to FIGS. 15 to 18 that it is effective to set bad bit lines in a floating state in case there are two or more bad cells in a cell array. In detail, such a case will be examined here that there are two independent bad cells DC1 and DC2. DC1 and DC2 are disposed between word line WL1 and bit line BL1 and between word line WL3 and bit line BL3, respectively.

Figure 15:
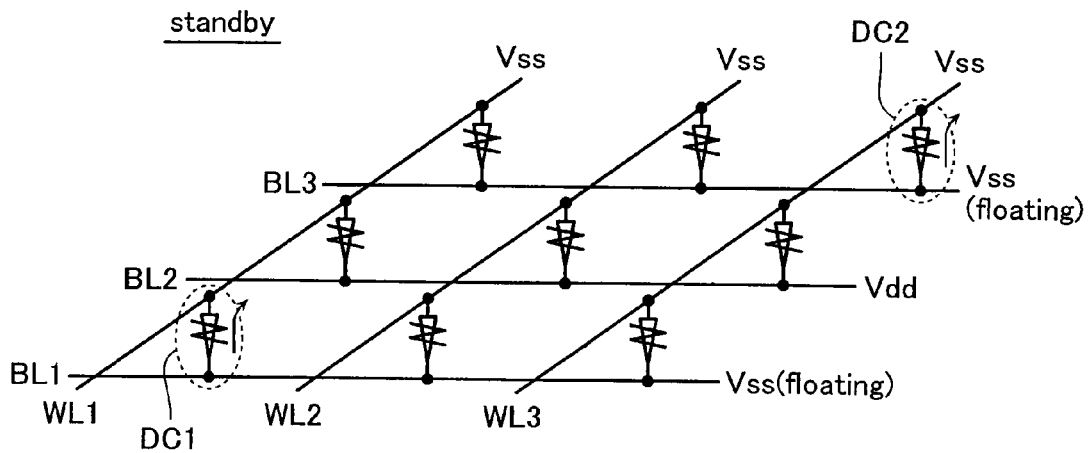
FIG. 15 is a diagram for explaining an influence in the cell array at a standby time in case there are two bad cells, and bad bit lines are set in a floating state.

FIG. 15 shows a standby state. Floating bad bit lines BL1 and BL3, to which bad cell DC1 and DC2 are coupled, respectively, are drawn to Vss by word lines with Vss applied. Therefore, there is not a forward-biased cell anywhere, and there is no influence of the bad cells. This can be said too in case there are numerous bad cells.

Figure 16:
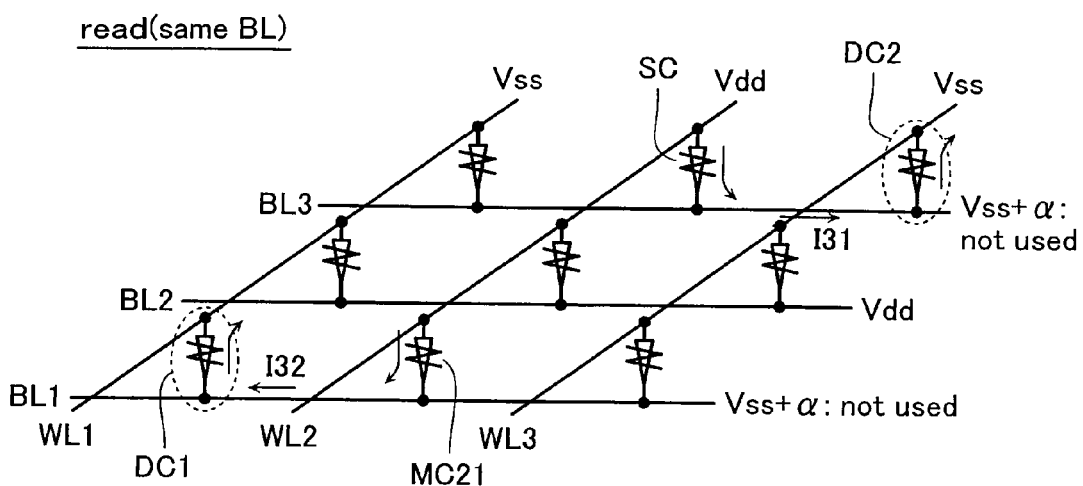
FIG. 16 is a diagram for explaining an influence in the cell array at a read time in case there are two bad cells, and bad bit lines are set in a floating state.

FIG. 16 shows an access state of selected cell SC. Selected cell SC is coupled to bad bit line BL3, to which bad cell DC2 is coupled, and word line WL2 which is not coupled to any bad cells. In this case, although the selected bit line BL3 is unused in practice and there is no problem in the data read mode, the influence for other cells will be examined here.

Since the selected word line WL2 is set at Vdd, there is generated a current path of I31 between the selected word line WL2 and unselected word line WL3 (coupled to bad cell DC2 and set at Vss) via selected cell SC and floating bad bit line (i.e., selected bit line) BL3. Similarly, there is generated another current path of I32 between the selected word line WL2 and unselected word line WL1 (coupled to bad cell DC1 and set at Vss) via unselected cell MC21 and floating bad bit line (i.e., unselected bit line) BL1. With these current paths, bad bit lines BL1 and BL3 are boosted to Vss+α.

In this case, since other cells except bad cells are in a reverse-biased state, there is no problem. The selected cell SC is not disturbed in a read mode with Vdd(read). While selected cell SC is disturbed in a write mode with Vdd(write), this selected cell SC is not used in practice, and there is no problem excepting that additional access current flows. With respect to other bad bit lines, the situations are as well as described above. Note that the more the bad cells, the more the additional access current.

Figure 17:
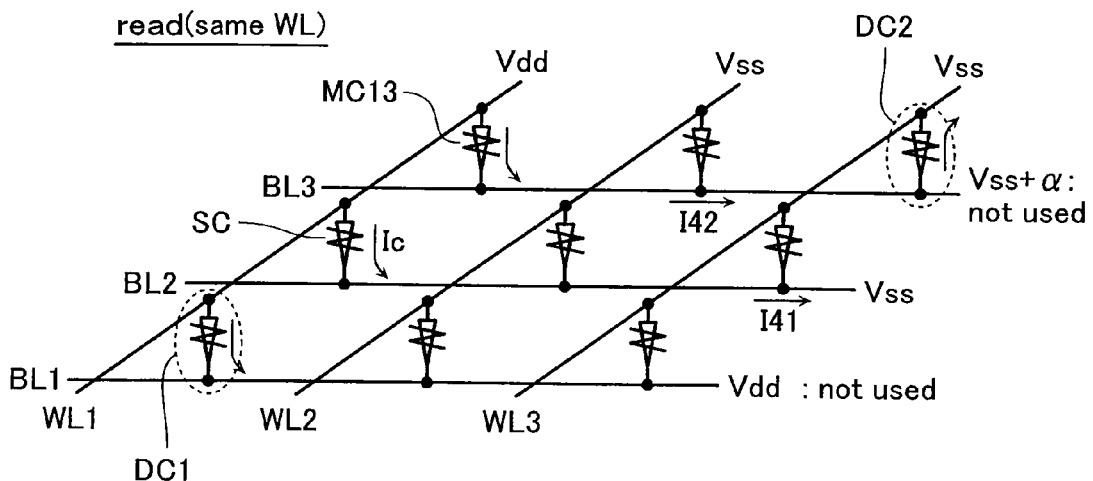
FIG. 17 is a diagram for explaining another influence in the cell array at a read time in case there are two bad cells, and bad bit lines are set in a floating state.

FIG. 17 shows another access state, in which word line WL1 coupled to bad cell DC1 and good bit line BL2 are selected. In this case, with the selected word line WL1 with Vdd applied, the floating bad bit line BL1 is boosted to Vdd via bad cell DC1. Therefore, other cells on the bad bit line BL1 are reverse-biased and influence anywhere. Current I41 flows on the selected bit line BL2 based on the selected cell's current Ic, so that the selected cell SC may be normally read or written.

Another bad bit line BL3, which is coupled to another bad cell DC2 and set in a floating state, serves as a current path of current I42 between the accessed word line WL1 and unselected word line WL3 together with unselected cell MC13 and bad cell DC2 coupled to word lines WL1 and WL3, respectively. As a result, this bad bit line BL3 is boosted to be higher than Vss, i.e., Vss+α. Other cells except those coupled to the selected word line and bad cells are reverse-biased, so that the selected cell SC is not disturbed.

Figure 18:
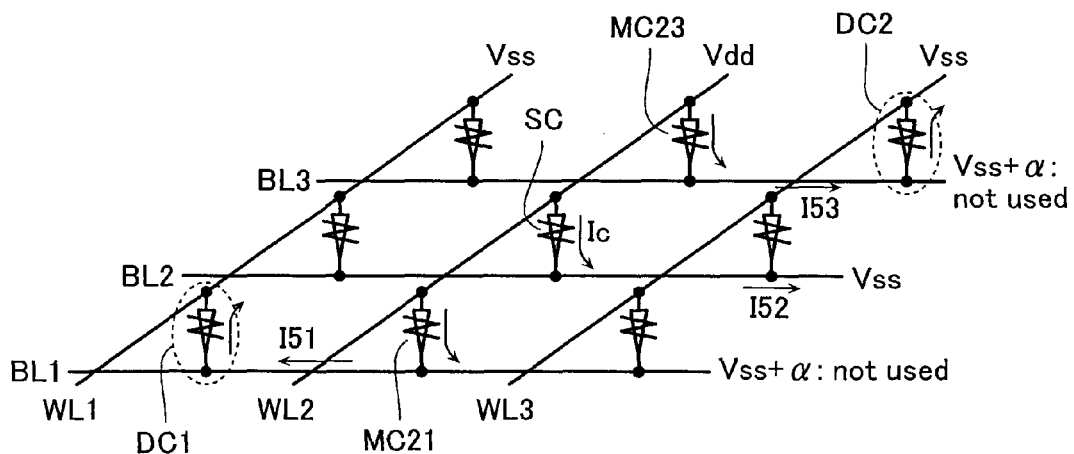
FIG. 18 is a diagram for explaining still another influence in the cell array at a read time in case there are two bad cells, and bad bit lines are set in a floating state.

FIG. 18 shows still another access state. In this state, a selected word line and a selected bit line are ones WL2 and BL2, which are not coupled to bad cells. The cell current of the normal selected cell SC flows from the selected word line WL2 to the selected bit line BL2 as current I52, and it will be input to the sense amplifier.

There are current I51 and I53 carried from the selected word line WL2 to floating bad bit lines BL1 and BL3 via unselected cells MC21 and MC23, respectively. Therefore, these bit lines BL1 and BL3 will be boosted to Vss+L. Although normal cells on these bad bit lines may be disturbed, there is no problem because these bit lines are not used. The selected cell SC has also no problem.

Next, the influence of bad cell DC between cell arrays will be explained below with reference to FIGS. 19-21.

Figure 19:
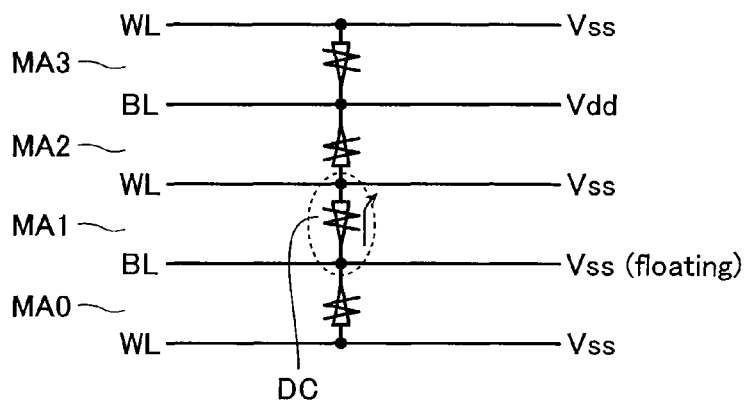
FIG. 19 is a diagram for explaining an influence between cell arrays at a standby time in case a bad bit line is set in a floating state.

FIG. 19 shows a standby state defined by the condition of: all word lines are set at Vss; and all bit lines at Vdd. The bit line, to which bad cell DC belongs, is set in the floating state of Vss. Therefore, there is no influence of bad cell DC on the other cells.

Figure 20:
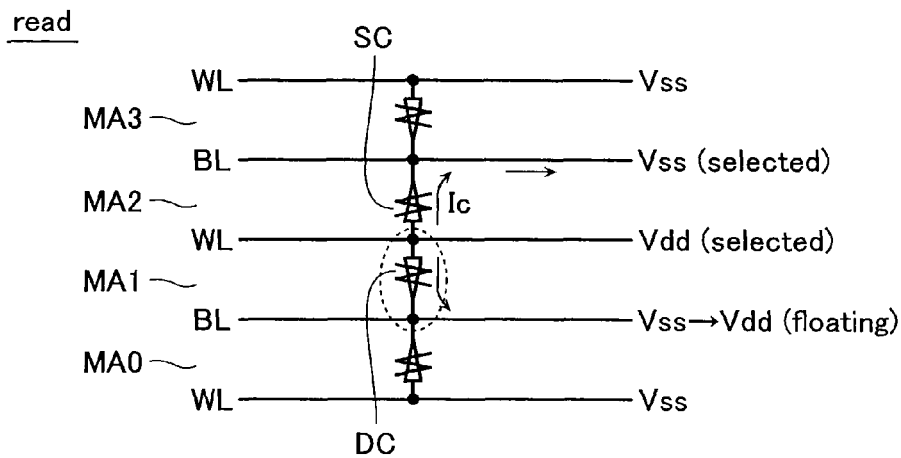
FIG. 20 is a diagram for explaining an influence between cell arrays at a read time in case a bad bit line is set in a floating state.

FIG. 20 is an access state defined by the condition of: a word line, to which bad cell DC belongs, is selected and set at Vdd; and a selected bit line at Vss. Cell current Ic of the selected cell SC is carried on the selected bit line to the sense amplifier. Therefore, this access is not problematic. The floating bit line is charged up to Vdd via bad cell DC, but this bit line is unused. Therefore, this also is not problematic.

Figure 21:
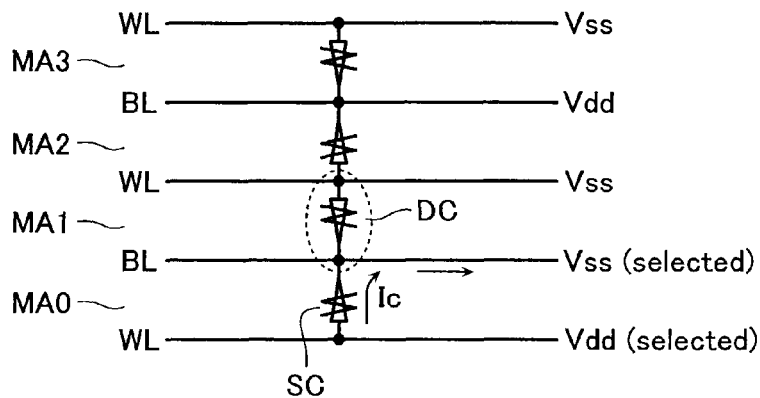
FIG. 21 is a diagram for explaining another influence between cell arrays at a read time in case a bad bit line is set in a floating state.

FIG. 21 shows another access state defined by that selected cell SC is neighboring to and underlying bad cell DC. In this case, cell current of the selected cell SC flows on the selected bit line to be input to the sense amplifier. There is no cell current in the bad cell DC, and there is no influence on the other cells.

So far, it has been explained the effectiveness of that a bad bit line is set in a floating state. Although leakage current carried via the word line coupled to the bad cell increases, the accessed cell is not erroneously read and not disturbed. By contrast, if a word line coupled to the bad cell is set in a floating state, this influences on accessing of the other normal cells. This situation will be explained below.

Figure 22:
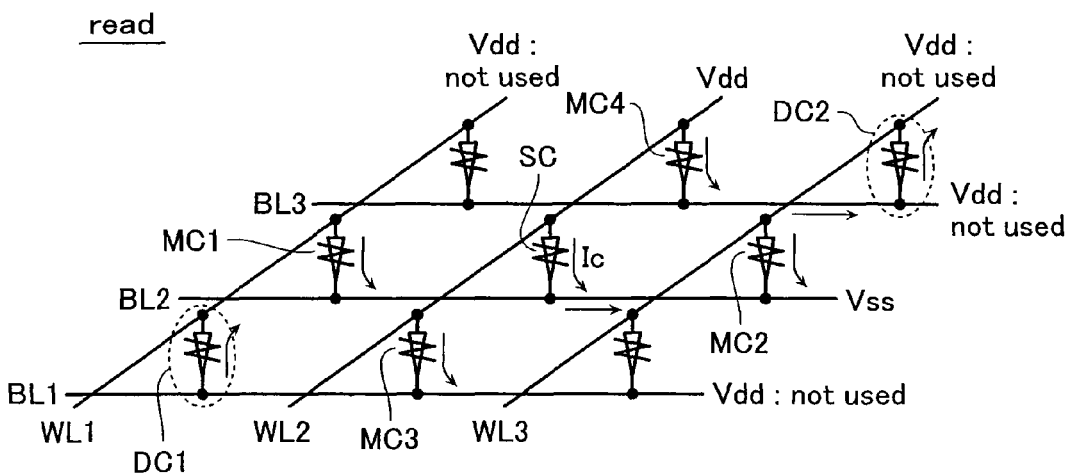
FIG. 22 is a diagram for explaining the problem at a read time in case a bad word line is set in a floating state together with a bad bit line.

FIG. 22 shows an access state defined by that not only bit lines BL1 and BL3 coupled to bad cells DC1 and DC2 are set to be floating but also word lines WL1 and WL3 coupled to these bad cells are set to be floating, and cross-point cell SC between word line WL2 and bit line BL2 is selected.

In this case, floating bit lines BL1 and BL3 are charged up to Vdd from selected word line WL2 via unselected cells MC3 and MC4, respectively. In response to it, floating word lines WL1 and WL3 are charged up to Vdd from the bit lines BL1 and BL3 via bad cells DC1 and DC3, respectively. As a result, unselected cells MC1 and MC2 disposed between Vdd word lines WL1, WL3 and the selected bit line BL2 are set in a quasi-access state. Explaining in other words, multiple selection of cells is generated on the selected bit line BL2, so that read or write will be failed.

Figure 23:
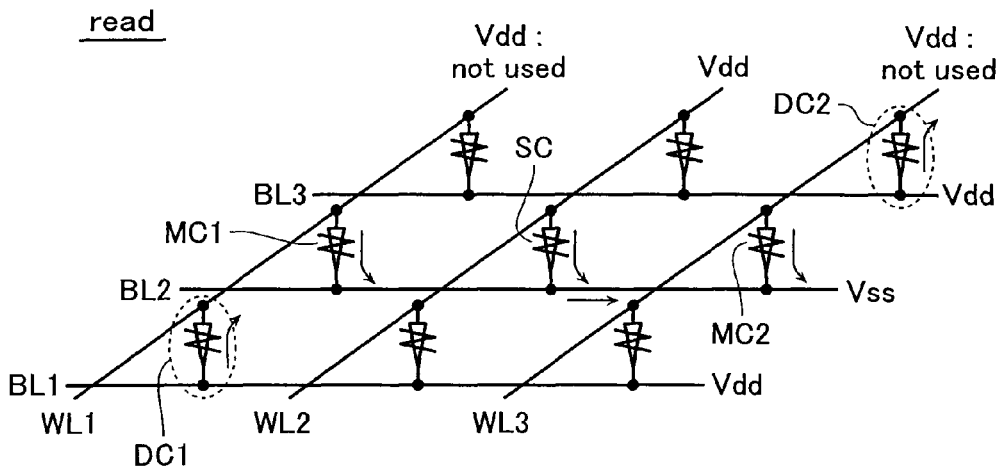
FIG. 23 is a diagram for explaining the problem at a read time in case only a bad word line is set in a floating state.

By contrast, FIG. 23 shows an access state that only word lines WL1 and WL3 coupled to bad cells DC1 and DC2 are set to be floating, and word line WL2 and bit line BL2 are selected on the same bad cell situation as that shown in FIG. 22. In this case, word lines WL1 and WL3 are charged up to Vdd from the Vdd unselected bit lines BL1 and BL3 via bad cells DC1 and DC2. Therefore, there is generated on the selected bit line BL2 such a multiple selection that selected cell SC is accessed, and unselected cells MC1 and MC2 are quasi-accessed.

As described above, it should be appreciated that to be able to do normal access for normal cells, it is material to make bad bit lines (i.e., wirings set at the lower level Vss at a cell current detecting time) floating.

[Circuit Configuration Including Measures Against Bad Cell]

Next, a circuit system for achieving such a method that a bit line coupled to a bad cell (i.e., bad bit line) is made to be floating for limiting the influence of the bad cell.

Figure 24:
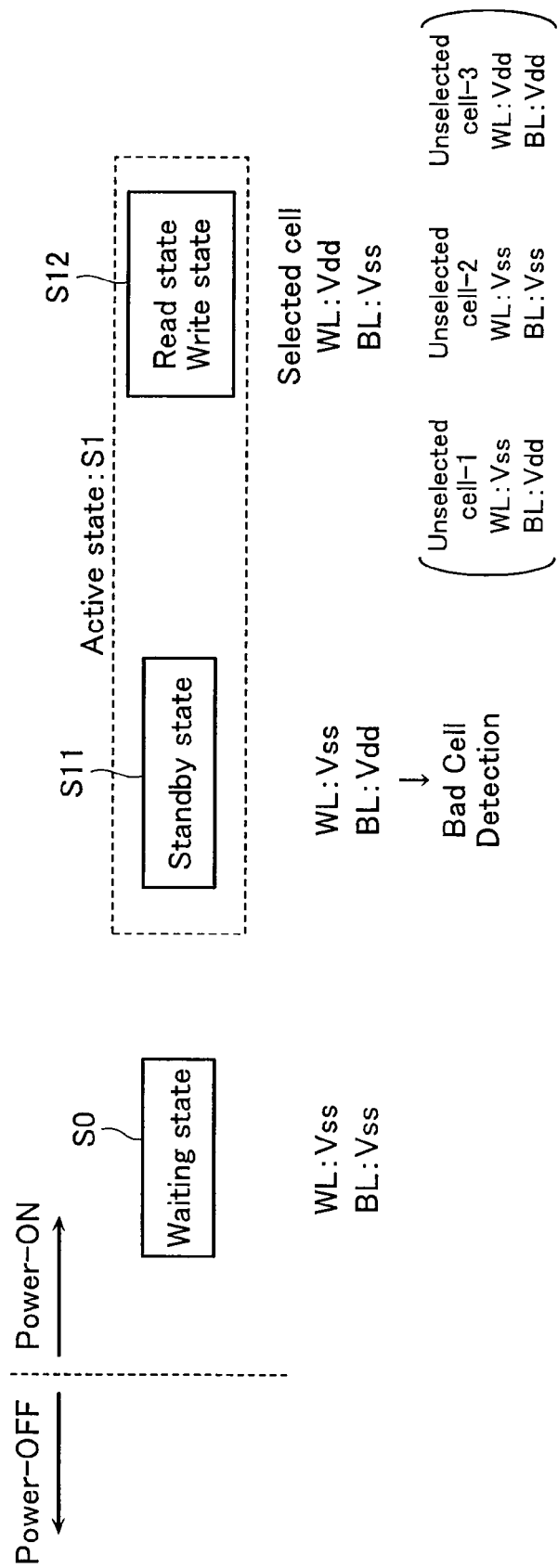
FIG. 24 shows cell array states set after power-on in the embodiment.

Initially, a method of setting the cell array state will be explained with reference to FIG. 24. As the main power supply is on, the cell array is set in a waiting state S0, and then set in an active state S1, which includes a standby state S11 and an access state (i.e., read/write state) S12.

In the waiting state S0, all word lines WL and all bit lines BL in the cell array are set at ground potential Vss. This is such a state that there is no load for cells, and there is not generated leakage current in bad cells.

The active state S1 is a phase in which cells are accessed. The standby state S11 is such a state that the cell array is ready to be accessed with no diodes of cells forward-biased. That is, in the standby state, all word lines are set at Vss while all bit lines are set at Vdd or over Vdd, for example.

Operations performed in this standby state are as follows: detecting bad sells; setting the bad bit lines coupled to the bad cells in a floating state; and replacing the bad bit line with a spare bit line.

In the access state S12, a cross-point cell (selected cell) between a selected word line and a selected bit line is subjected to data read or data write. At this time, the selected word line is set at Vdd or about Vdd; and the selected bit line at Vss.

There are three unselected cell's situations in this access state as follows: a first type of unselected cell coupled to a Vss word line and a Vdd bit line as well as the standby state (unselected cell-1); a second type of unselected cell defined as one disposed on the selected bit line, i.e., both of word line and bit line coupled to this unselected cell are set at Vss (unselected cell-2); and a third type of unselected cell defined as one disposed on the selected word line, i.e., both of word line and bit line coupled to this unselected cell are set at Vdd (unselected cell-3).

The Vdd level in the active state is defined in detail as follows: Vdd(read) used at a read time that is selected as possible to prevent the selected cell from being disturbed; and Vdd(write) set higher than Vdd(read) to be used at a write time that is selected as being possible to sufficiently change the selected cell's resistance with voltage or Joule's heat.

It will be explained below the detailed configuration of read/write circuit 2 shown in FIG. 1, which is formed to contain a measure circuit for limiting the influence of the bad cells. Bit lines drawn via the vertical via-wirings disposed at the both sides of the cell array to the substrate to be input to the bit line select circuit 24 (24a, 24b), and selectively coupled to address buses 23 (23a, 23b) in accordance with externally supplied address and command.

The signals on the data buses 23 are input to the sense amp arrays 22 (22a, 22b). At a read time, read data will be decided by the sense amplifier while at a write time, the sense amplifier monitors the selected cell's current and cut off it when the data write is completed.

Data buses 21a and 21b serve for transferring data between the sense amplifier arrays 22 and the external. That is, data bus 21a underlying the cell array is divided into two busses 21b crossing the data bus 21a, on which data are output to or input from the external.

Word lines drawn to the substrate via the vertical via-wring disposed on the both sides of the cell array in the word line direction are input to the word line decoder/multiplexer circuit 25 (25a, 25b), which selectively set the word line levels in accordance with the externally supplied address and command.

In case of this embodiment, word lines are drawn from the cell array block to pass above the area of data buses 21b and input to the word line decoder/multiplexer 25a, 25b. Therefore, it is in need of using an additional word line length. However, not only bit lines but also word lines are drawn alternately from the both sides of the cell array, there are some merits as follows: the wiring pitch in the vertical via-wirings 31 and 32 may be set to be twice the minimum pitch; the wirings are arranged in a symmetrical state; the circuit property is easily made uniform; the layout becomes compact; and the exposure condition with the minimum feature size in the lithography step may be made effective.

Figure 25:
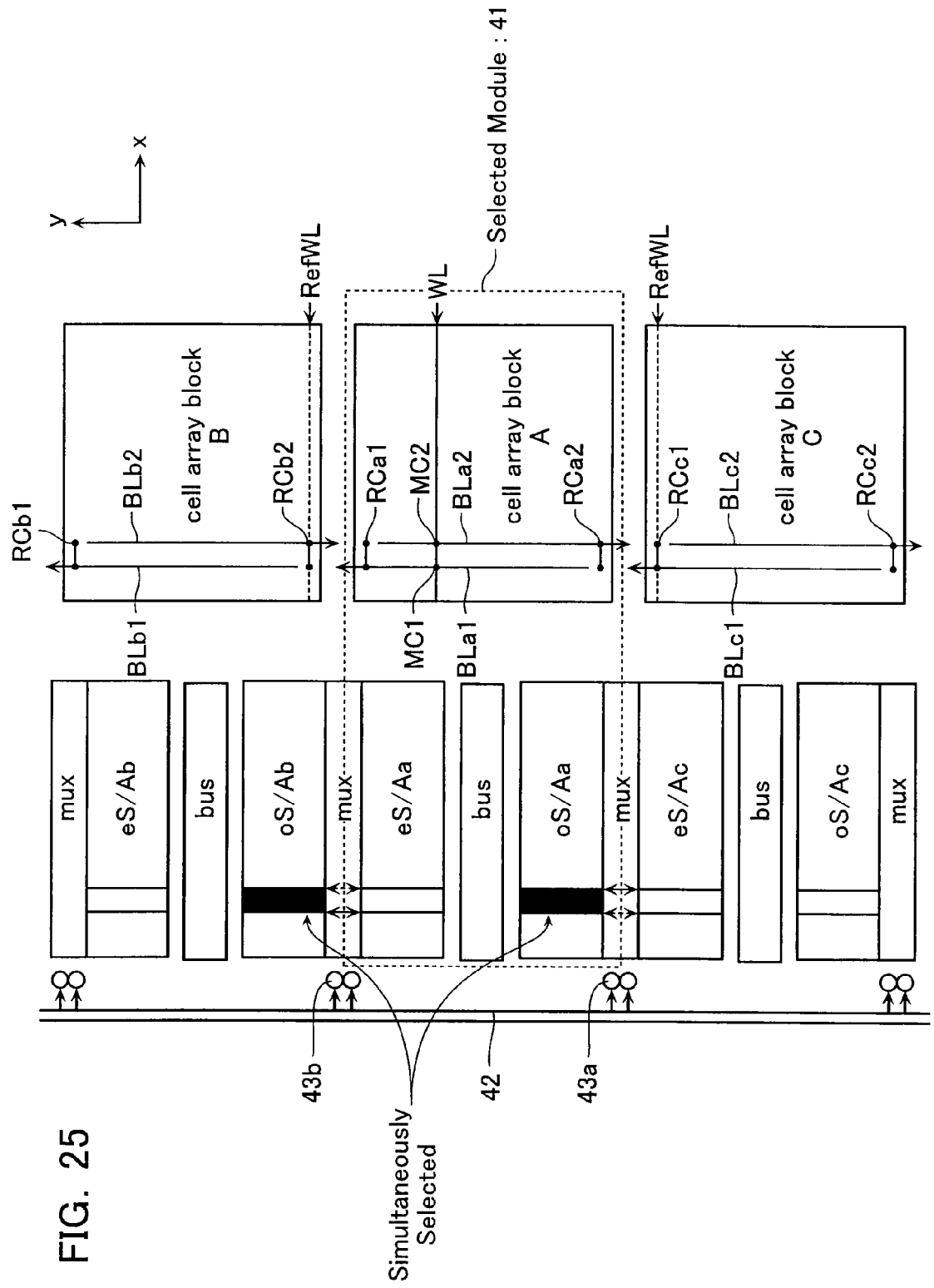
FIG. 25 shows a sense scheme, in which a reference cell is prepared in the adjacent cell array block.

FIG. 25 is a diagram for explaining the method of constituting the sense system and reference cells in each cell array block in a case that multiple cell array blocks are arranged in a matrix manner. When one word line is selected in the cross-point type of 3D cell array block, cell data are output on all bit lines in the selected cell array. Therefore, if a reference cell is set in the same cell array as the selected cell, and a word line of the reference cell (i.e., reference word line) is selected simultaneously with the selected word line, multiple selection will occur.

To avoid such the multiple selection, it is desired to set a reference cell in a cell array adjacent to the cell array, in which a selected cell exists.

Further, assuming that the cell array layers are referred to as 1st cell array, 2nd cell array, 3rd cell array and so on in order from the lowest layer, i.e., 0-th cell array, the cell array layers are divided into two groups of even layer group, e-group, and odd layer group, o-group. In addition, assuming that sense amplifier arrays shared by the e-group layers and o-group layers are designated by "eS/A" and "oS/A", respectively, the sense amplifier arrays are arranged as shown in FIG. 25.

Shown in FIG. 25 are adjacent three cell array blocks B, A and C arranged in the bit line direction. Here, a cell array clock and the corresponding underlying circuit serve as a "unit module", and it is assumed here that a word line WL is selected in the central unit module 41 of cell array block A. At this time, reference word lines RefWL are simultaneously selected on the cell array A side ends in the adjacent two cell array blocks B and C.

The details will be explained noticing the memory cells MC1 and MC2, which are driven by a word line WL and disposed on the adjacent two bit lines BLa1 and BLa2. One end on the cell array C side of one bit line BLa1, to which cell MC1 is coupled, serves as an open end; and another end on the cell array B side is coupled to the sense amplifier array underlying the cell array via the vertical via-wirings. While, one end on the cell array B side of the other bit line BLa2, to which cell MC2 is coupled, serves as an open end; and another end on the cell array C side is coupled to the sense amplifier array via the vertical via-wirings.

Bit line BLb2 coupled to the reference cell RCb2 selected by reference word line RefWL disposed near to the cell array block A in the cell array block B constitutes a pair together with bit line BLa1 in the cell array block A, and this pair of bit lines are coupled to a sense amplifier. Similarly, bit line BLc1 coupled to the reference cell RCc1 selected by reference word line RefWL disposed near to the cell array block A in the cell array block C constitutes a pair together with bit line BLa2 in the cell array block A, and this pair of bit lines are coupled to another sense amplifier.

As described above, one bit line selected in the cell array A and the corresponding bit line selected in the cell array B constitute a pair in an open bit line scheme. Similarly, one bit line selected in the cell array A and the corresponding bit line selected in the cell array C constitute another pair in the open bit line scheme.

In this case, according to one sense amp assignment, with respect to the above-described two pairs of bit lines, one sense amplifier eS/Aa underlying the cell array block A and another sense amp eS/Ac underlying the cell array block C and near to the cell array block A are used simultaneously. Alternatively, one sense amplifier oS/Aa underlying the cell array block A and another sense amp oS/Ab underlying the cell array block B and near to the cell array block A are used simultaneously.

Which is used in two systems of sense amplifiers is defined by whether the selected cells belong to e-group layers or o-group layers. A reference cell is formed of multiple cells on adjacent two bit line positions on the cell array end. Further, multiple reference cells may be coupled in parallel with each other with a multiplexer portion in accordance with the sense amplifier system, so that a suitable reference cell's current (i.e., reference current) will be adjusted.

To select word lines and sense amplifiers as described above, address information including module selection address, word line/reference word line selection address and bit line address transferred on the address bus 42 are selected with address switch circuits 43a and 43b, which are disposed at the corners of the respective cell array blocks. When a module adjacent to an address switch circuit is selected, the address switch circuit is turned on simultaneously.

Figure 26:
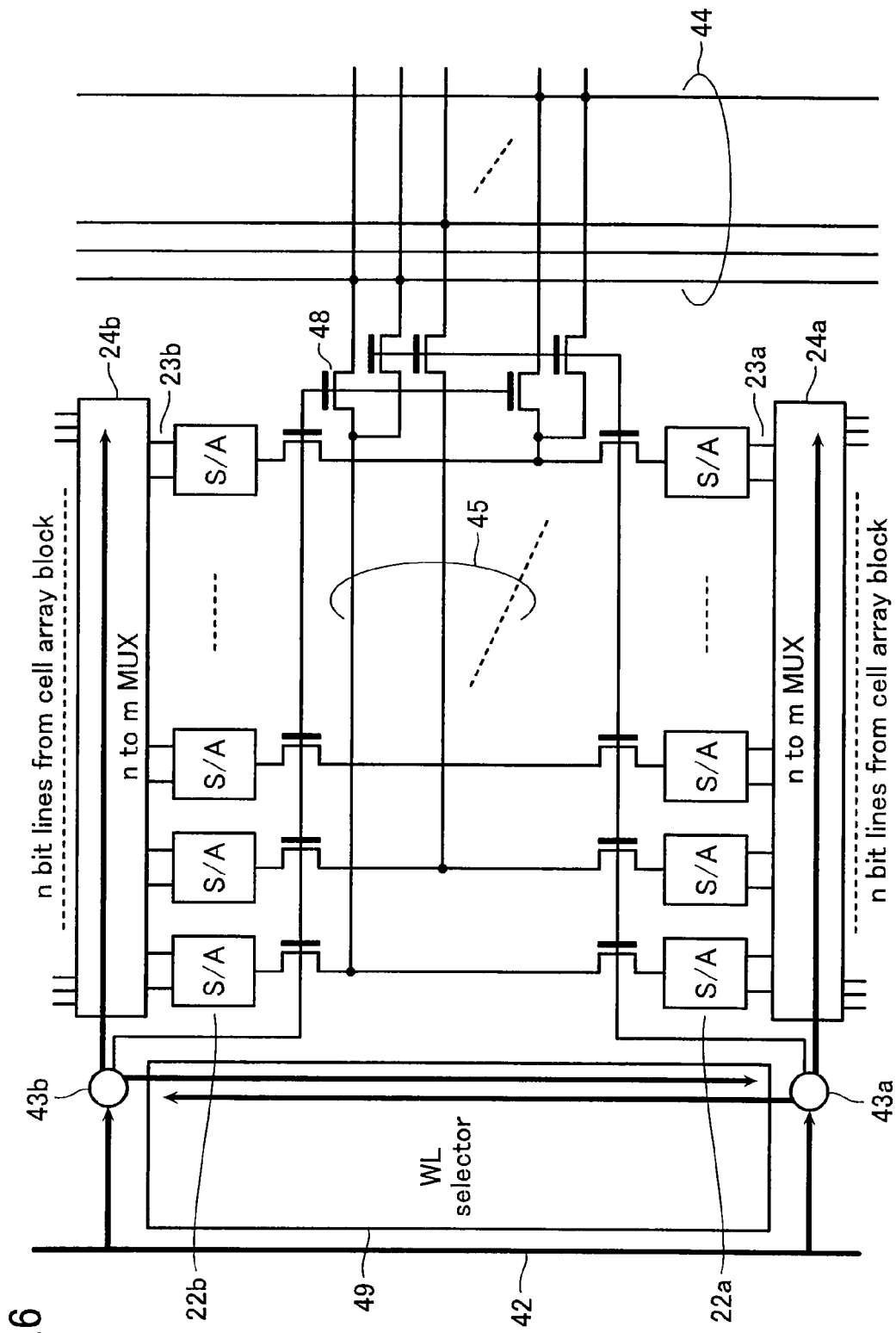
FIG. 26 shows the sense amplifier and the periphery circuit for a cell array block.

FIG. 26 shows the address bus 42 and other circuit portion relating to data transferring noticing one cell array block. With respect to a cell array block, as shown in FIG. 26, there are word line selector 49 (i.e., the body of word line decoder 25); bit line select circuits 24a and 24b, each of which selectively couple "n" bit lines drawn from one side of a cell array block to "m" sense amplifiers; array buses 23a and 23b, which transfer bit line data to the sense amplifiers; and sense amplifier arrays 22a and 22b, in each of which "m" sense amplifiers are arranged.

Local bus 45 (corresponding to data bus 21a) transfer "m" bit data selected from one of opposed sense amplifier arrays via a select gate. If a cell array block is selected, the local bus 45 is coupled to global bus 44 (corresponding to data bus 21*b*) via gate 48, which serves for separating the global bus 44 from the local bus 45 at an unselected time, thereby reducing the wiring capacitance. If the wiring capacitance is not problematic, there is no need of preparing this gate 48.

Address switch circuits 43*a*, 43*b* selected by cell array block selection address on the address bus 42 serve for supplying the signals on the address bus 42 to the both ends of the word line selector 49, and transfer simultaneously such an information bit that designates which of the e-group sense amplifier array and the o-group sense amplifier array is selected, thereby selecting sense amplifiers to be coupled to the local bus 45.

Figure 27:
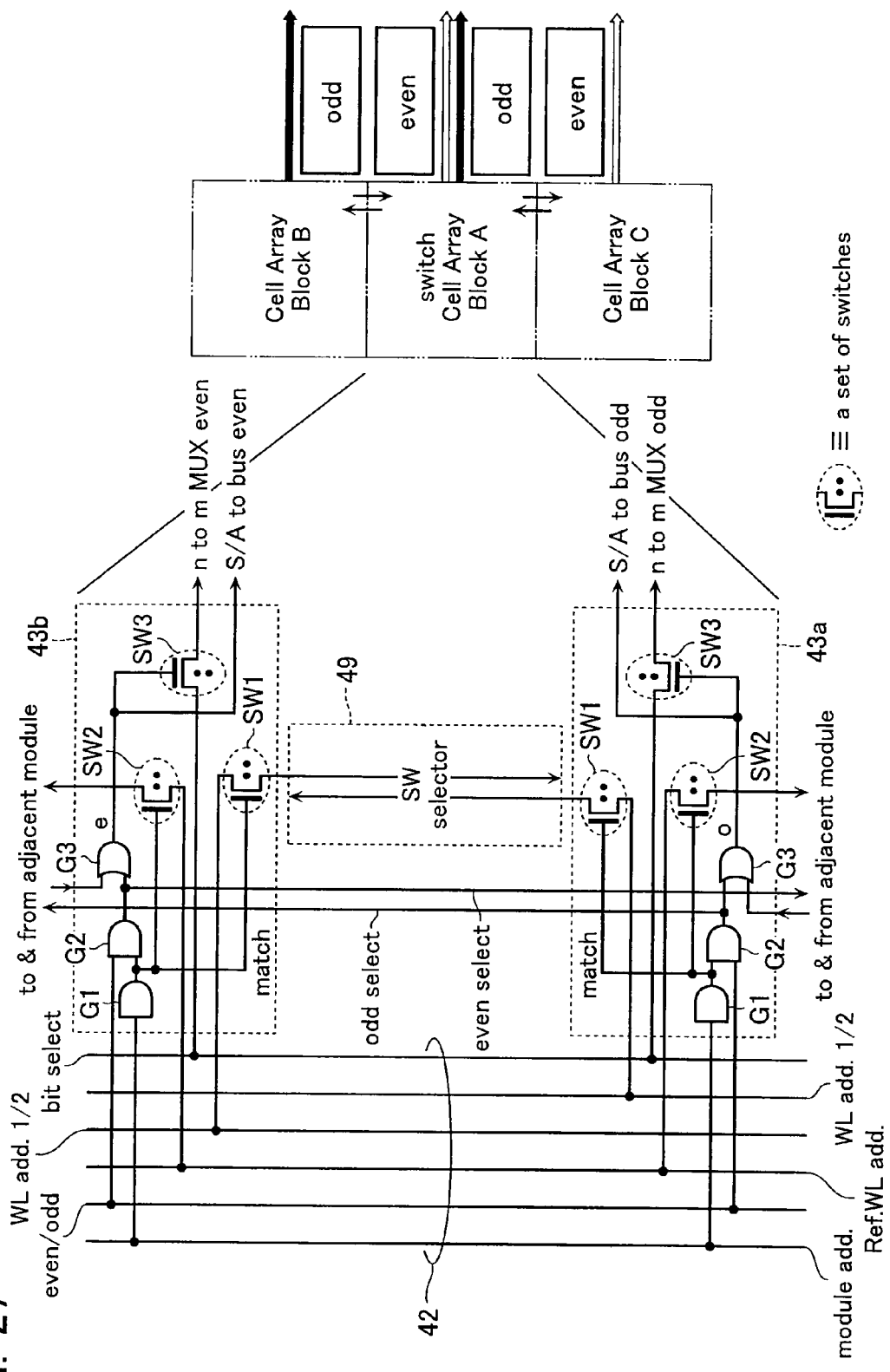
FIG. 27 shows a detailed configuration of the address switch circuit.

FIG. 27 shows a detailed configuration of the address switch circuits 43*a* and 43*b* noticing one cell array block.

Address bus 42 contains module address "module add."; even/odd address "even/odd" serving for selecting e-group sense amplifier (eS/A) and o-group sense amplifier (oS/A); reference word line address "RefWL add."; word line address "WL add. ½" to be supplied to and selected by word line selector 49; and bit line select address "bit select" serving for selectively coupling between bit lines and sense amplifiers in the bit line multiplexer.

Each of address switch circuits 43*a* and 43*b* has: switch SW1 supplying word line address "WL add. ½" to one end of the word line selector 49; switch SW3 for supplying bit line select address "bit select", which serves for selectively coupling the bit line select circuits 24*a*, 24*b* and sense amplifier arrays; switch SW2 for transferring reference word line address "RefWL add." to adjacent module; and gates G1-G3 for selectively driving these switches.

Here, each of switches SW1-SW3 is formed of a set of switching transistors driving the corresponding address bits.

As shown on the right side of FIG. 27, while even sense amplifiers are selected in cell array block A, even sense amplifiers are selected simultaneously in cell array block C, and while odd sense amplifiers are selected in cell array block A, odd sense amplifiers are selected simultaneously in cell array block B. Therefore, switch circuits 43*a*, 43*b* send signals to the corresponding switch circuits in adjacent modules for controlling them.

The signal transferring operation will be explained in detail for the respective signals. Module address "module add." is formed of several bits used for selecting a module. In a cell array block, in which the module address is detected to be matched with a bit pattern, the corresponding switch becomes on. The bit pattern matching is detected with AND gate G1, and switch circuits 43*a* and 43*b* in the corresponding cell array block are selected, so that match signal "match" will be output. In accordance with this match signal, switch SW1 is selected, and address signals without relation to even and odd are taken in.

Even/odd address "even/odd" is that used for selecting e-group sense amplifiers or o-group sense amplifiers. AND logic between this address and the match signal "match" is taken in gate G2, and even select signal "even select" or odd select signal "odd select" is generated. Odd select signal is also supplied to the switch circuit in an adjacent cell array block on the upper side while even select signal is also supplied to the switch circuit in another adjacent cell array block on the lower side.

When even select signal "even select" is raised, even sense amplifier select signal "e" used for selecting even sense amplifier, eS/A, in the selected cell array block A is raised in the switch circuit 43*b*. This select signal "e" serves for driving switch SW3, which serves for transferring coupling signal, "S/A to bus even", used for selectively coupling between eS/A and data bus, and address signal used for selectively coupling the sense amplifiers and bit lines. There is disposed an OR gate G3 in the signal "e" path for taking in the select signal "e" in this cell array block A when it is raised in the upper side cell array block B.

When odd select signal "odd select" is raised, odd sense amplifier select signal "o" used for selecting odd sense amplifier, oS/A, in the selected cell array block A is raised in the switch circuit 43*a*. This select signal "o" serves for driving switch SW3, which serves for transferring coupling signal, "S/A to bus odd", used for selectively coupling between oS/A and data bus, and address signal used for selectively coupling the sense amplifiers and bit lines. There is disposed an OR gate G3 in the signal "o" path for taking in the select signal "o" in this cell array block A when it is generated in the lower side cell array block C.

Reference word line address "RefWL add." is for designating which reference word lines are to be raised in the cell array block adjacent to the selected cell array block. Without relation to the even or odd sense amplifiers, the reference word line near to the selected cell array block A will be always raised in the adjacent cell array block. For this purpose, reference word line address "RefWL add." is supplied to the reference word line selection portion of the word line selector in adjacent cell array block via switch SW2, which is driven by match detection signal "match".

Two word line addresses "WL add. ½" are combined to constitute the whole word line address bits used for selecting a word line. This is, without relation to even or odd sense amplifiers, input to the word line selector via switch SW1, which also is driven by the match detection signal "match", and decoded for selecting a word line.

Bit line selection address "bit select" are information bits used for selectively coupling "n" bit lines to "m" sense amplifiers. This address signal is transferred via switch SW3, which is driven by signal "e" or "o", to be selection signal "n to m MUX even (or odd)" supplied to sense amplifier selection circuit (MUX/DEC) 24 on eS/A side or oS/A side.

Figure 28:
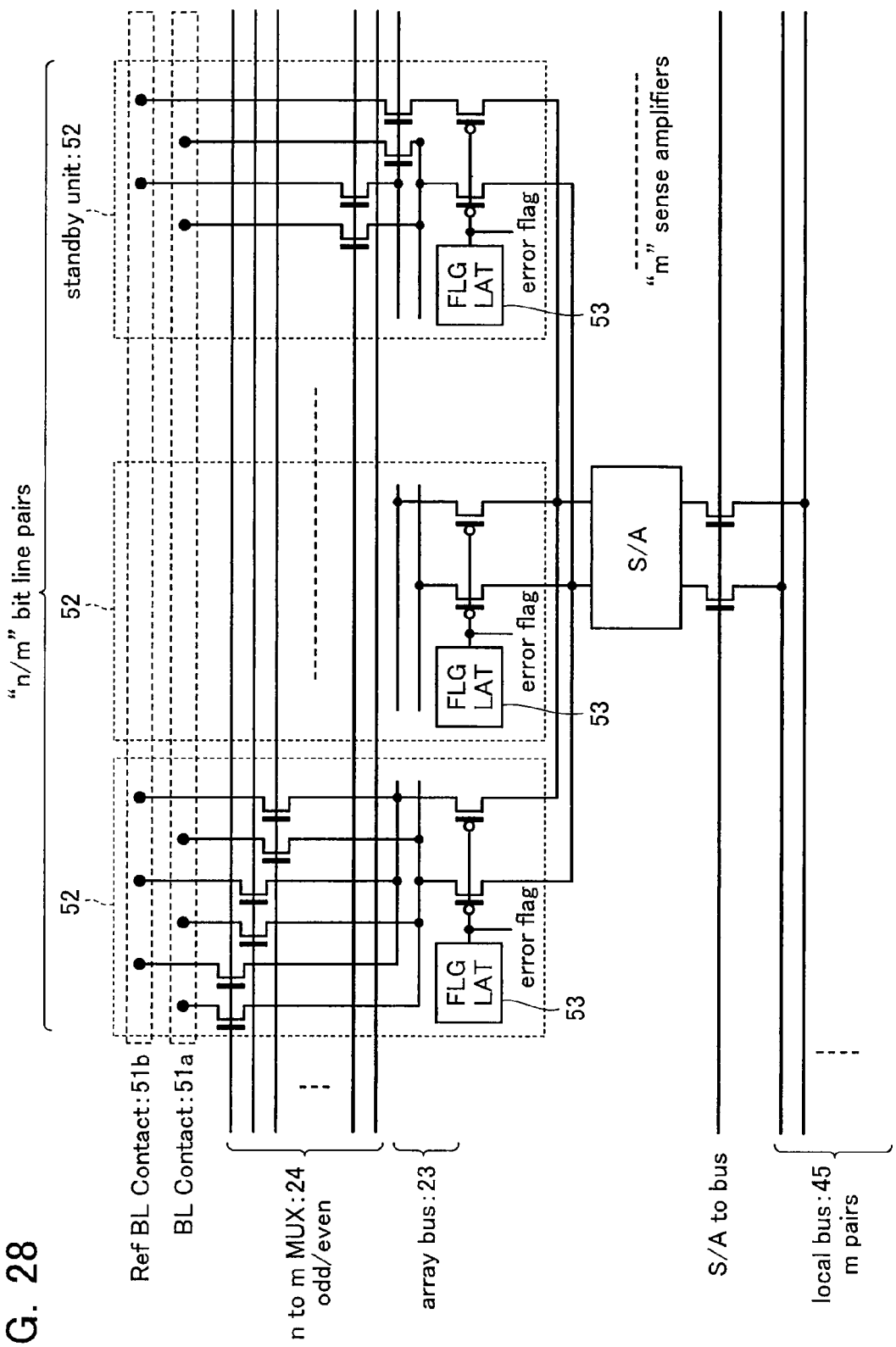
FIG. 28 shows the relationship between sense amplifiers and multiple standby units.

Next, the circuit portion for making a bit line coupled to a bad cell (i.e., bad bit line) floating will be explained with reference to FIG. 28, in which the circuit relationships between bit lines, sense amplifiers and local bus are shown.

"n" bit lines drawn from one cell array block and "n" reference bit lines drawn from adjacent cell array block constitute "n" bit line pairs, which are input to bit line selector circuit (n to m MUX) 24 via bit line contacts 51*a* and 51*b*. "m" sense amplifiers S/A are prepared so that one sense amplifier corresponds to "n/m" bit line pairs. One bit line pair is selectively coupled to one sense amplifier.

Every n/m bit line pairs sharing a sense amplifier serve as replacement units 52, which are to be replaced with each other in case there is detected a bad cell. These replacement units 52 each having multiple bit lines are subjected to "defect detection and replacement" in a standby state, thereby being referred to as "standby units" hereinafter. In FIG. 28, standby units 52 are shown as if these are on the read/write circuit underlying the cell array block. In practice, every cell array layers in the 3D cell array to be coupled to this circuit are grouped into these standby units 52.

Attached to the standby units 52 are defect detection circuits 53, each of which generates and holds a bad flag (or error flag) used for making all bit lines floating in such a standby unit that includes at least one bad bit line. This defect detection circuit 53 will be referred to as a "bad flag or error flag holding circuit" (FLG-LAT). As explained in detail later, the bad flag holding circuit 53 automatically performs a power-on reset operation in a standby state after the main power-on as follows: detecting defective or bad bit lines; generating a error flag for a standby unit, in which at least one defective cell is detected; setting all bit lines therein to be floating; and separating the standby unit from the sense amplifier.

Signals "odd/even" are those used for controlling the bit line select circuit 24 to selectively coupling a pair of bit lines to a sense amplifier. That is, "n/m" signals are finally decoded and transferred to data line pairs serving array buses 23, which are coupled to sense amplifiers S/A. A selected bit line pair and a sense amplifier are coupled to each other, and sensed data is transferred to local bus 45. The number of pairs of signal wirings in the local bus 45 is "m" as well as that of sense amplifiers S/A.

Figure 29:
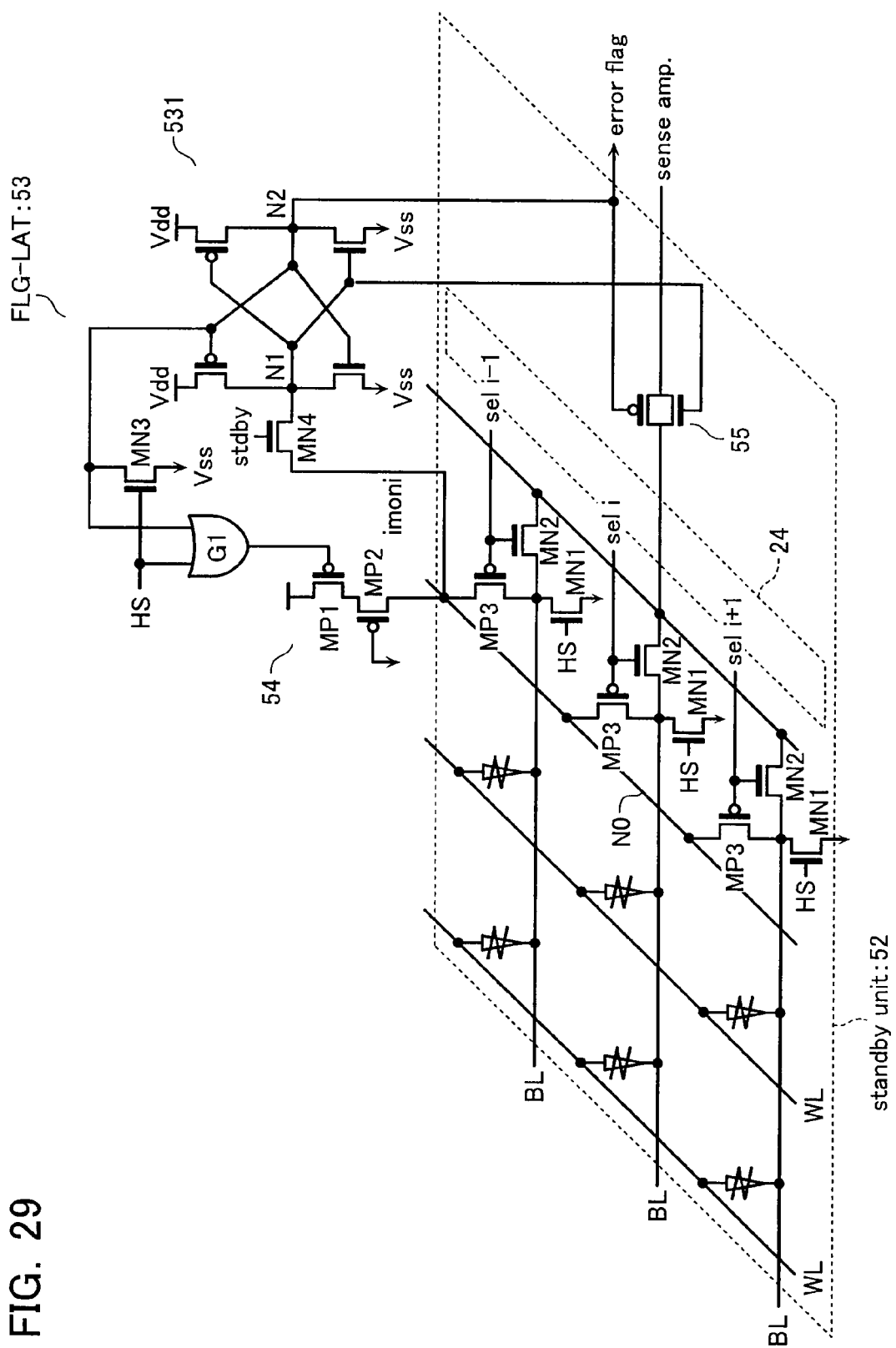
FIG. 29 shows the bad flag holding circuit prepared in the standby unit.

FIG. 29 shows a detailed configuration of the bad flag holding circuit (FLAG-LAT) 53. As described above, standby unit 52 is defined as a range of plural pairs of bit lines and reference bit lines. To simplify the explanation, reference bit lines are omitted here. The body of the bad flag holding circuit 53 is a latch circuit 531.

Each standby unit 52 has a bit line power supply circuit 54, which is separated from the main power supply of the memory and used for setting all bit lines at Vdd in the standby unit in the standby state. The bad flag holding circuit 53 serves for: monitoring the voltage drop of the bit lines, which are automatically precharged by the bit line power supply circuit 54; judging whether there is a bad cell or not; and setting the bit line coupled to the bad cell to be floating.

In the standby state, word lines are set at Vss while bit lines are set at Vdd. If a cell diode is defective, i.e., the reverse breakdown voltage is degraded, leakage current flows from a bit line to a word line, and it loads the bit line power supply circuit 54. While, the bit line power supply circuit 54 is formed to have a high impedance. Under this condition, the bit line level is extremely reduced in a standby unit including a bad cell. Therefore, monitoring the bit line level reduction, it becomes possible to detect a bad cell. In detail, the bit line power supply circuit 54 has PMOS transistors MP1 and MP2 connected in series. PMOS transistor MP1 serves as a power switch while PMOS transistor MP2 serves as a load with a high impedance, the gate of which is coupled to the ground potential.

Drain node N0 of PMOS transistor MP2 serves as a defect detection node disposed in common to the plural bit lines in a standby unit 52. The drain node N0 is coupled to the respective bit lines via PMOS transistors MP3, which are driven by selecting signals "sel j (j= . . . , i−1, i, i+1, . . . )" of the bit line selecting circuit (MUX/DEC) 24.

While the access state is not set, PMOS transistors MP3 are kept on. The drain node N0 of PMOS transistor MP2 in the bit line power supply circuit 54 is coupled to all bit lines in the standby unit 52 via PMOS transistors MP3. Reset-use NMOS transistors M11 are coupled to all bit lines.

Control signals "HS" and "stdby" applied to the bad flag holding circuit 53 are those automatically generated in the memory chip in the power-on reset operation. "HS" is a reset signal set at "H" in the waiting state after main power-on. With this signal "HS", PMOS transistor MP1 in the bit line power supply circuit 54 is turned off while NMOS transistor M11 is turned on. As a result, all bit lines are set at Vss.

Then, the signal "HS" becomes "L", so that the standby state is set. In response to it, the power supply circuit 54 becomes on, and reset-use NMOS transistors M11 are turned off. As a result, all bit lines are charged up to Vdd by the power supply circuit 54. The power supply circuit 54 has a high impedance and is expected to charge up the bit lines in case there is no bad cell. That is, the power supply circuit 54 functions normally with the high impedance.

When there are bad cells if any, leakage current flows, and the corresponding bit line is reduced in level, whereby the detection node N0 is reduced in level. Latch circuit 531 is disposed to detect the bit line level reduction and make the bit lines in the bad standby unit floating.

Latch circuit 531 is set in an "L" state of one node N2 with NMOS transistor MN3 driven by signal "HS" in the waiting state. Another node N1 of the latch circuit 531 is coupled to the detection node N0 via NMOS transistor MN4, which is on-driven by signal "stdby" set at "H" in the standby state.

Therefore, if the detection node N0 becomes "L" in the standby state, latch circuit 531 is inverted to output "H" at the node N2, and it serves as a bad flag or an error flag. This bad flag serves for turning off the bit line power supply circuit 54 via OR gate G1, thereby setting all bit lines in the bad standby unit to be floating. This state will be kept as it is while the main power supply is on.

The bad flag also turns simultaneously off the switch circuit 55, which serves for coupling a selected bit line to the sense amplifier in the standby unit. That is, a bit line is selected in the standby unit 52 by NMOS transistors MN2 selectively driven by the decoder 24 in the active state while the selected bit line is separated from the sense amplifier with the switch circuit 55 in case the standby unit 52 is detected as being defective.

Switch circuit 55 is a CMOS switch. This is because that the switch 55 is required to transfer different cell currents from each other at a read time and a write time. The CMOS switch is adaptable to the different requirements at the read time and the write time and transfers any cell current without transfer-loss due to the threshold voltage drop.

Figure 30:
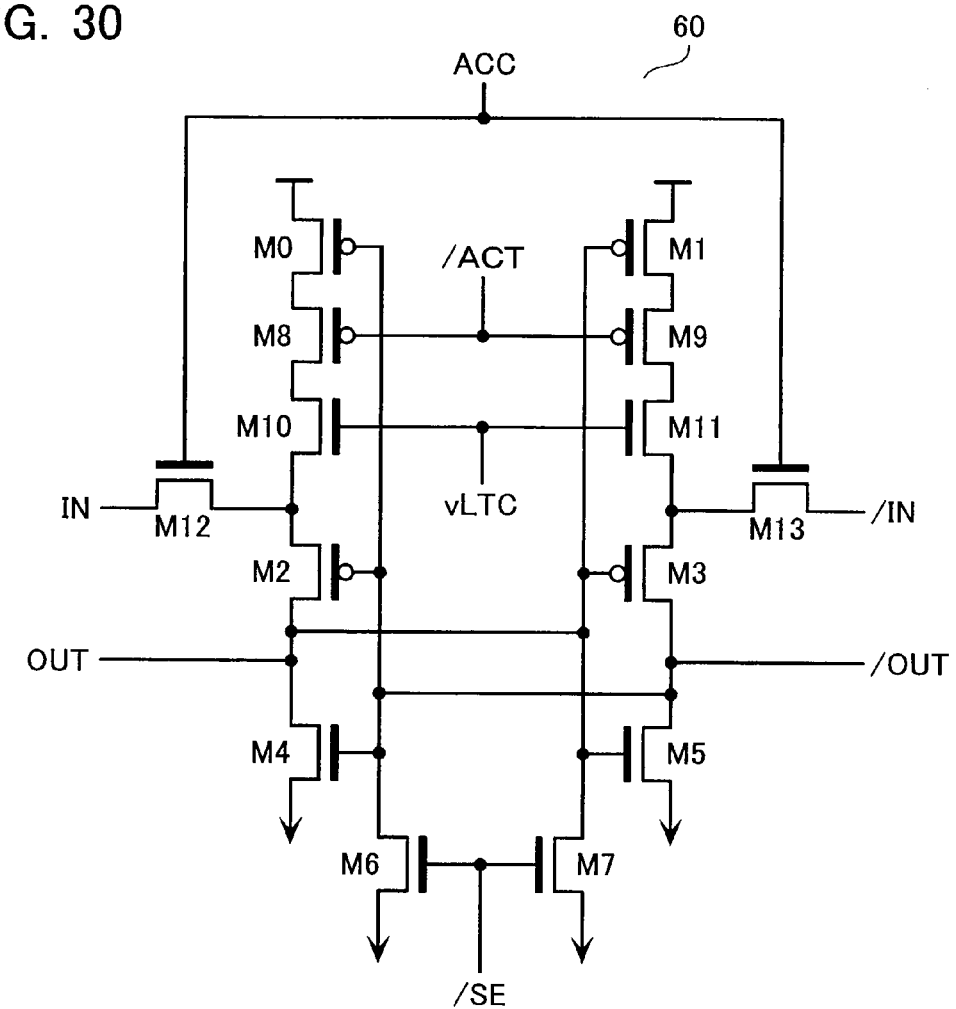
FIG. 30 shows the detailed configuration of the sense amplifier.
Figure 31:
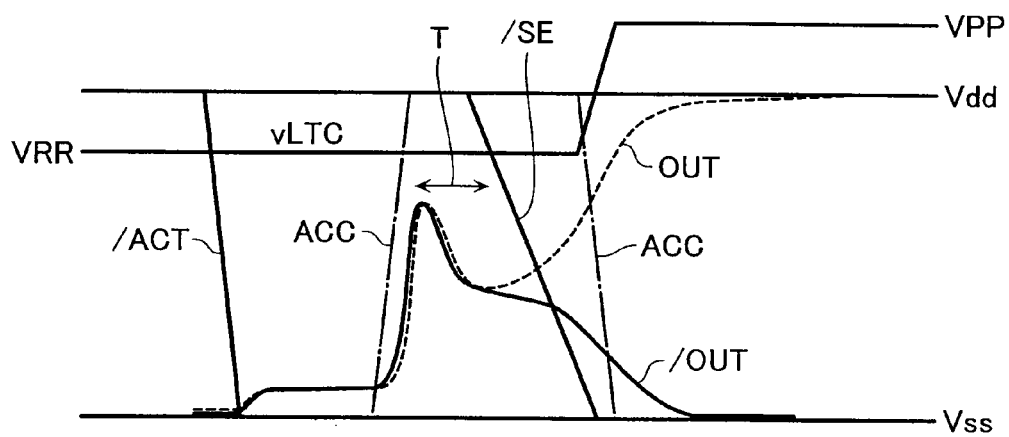
FIG. 31 shows the operation waveforms of the sense amplifier.

FIG. 30 shows a detailed configuration of a current-sink type of sense amplifier 60 as an example of the sense amplifier S/A, and FIG. 31 shows the operation waveforms. This sense amp compares a cell current with a reference current to detect cell data defined by a cell's resistance state, and it will be formed to be able to certainly perform current comparison with a current level such as 1 µA or less at a high speed.

Basic elements of this sense amp 60 are as follows: a CMOS inverter formed of PMOS transistors M0, M2 and an NMOS transistor M4, which have a common gate; and another CMOS inverter formed of PMOS transistors M1, M3 and an NMOS transistor M5, which have another common gate. These CMOS inverters constitute a latch circuit in such a way that these input/output nodes are cross-coupled to output nodes OUT and /OUT.

Serially Disposed between PMOS transistor M0 and PMOS transistor M2 are activation PMOS transistor M8 and current-limiting NMOS transistor M10. Similarly, activation PMOS transistor M9 and current-limiting NMOS transistor M11 are serially Disposed between PMOS transistor M1 and PMOS transistor M3.

Output nodes OUT and /OUT are coupled to Vss via NMOS transistors M4 and M5, respectively, and via NMOS transistor M7 and M6, respectively, driven by /SE. Sources of PMOS transistors M2 and M3 are coupled to input nodes IN and /IN via NMOS transistors M12 and M13, respectively, driven by ACC.

The basic operation of this sense amp is as follows. As shown in FIG. 31, when signal /SE is "H", activation signal /ACT is lowered, so that the pair of PMOS transistors M8 and M9 are turned on to make sense amp current flow. Successively, signal ACC is raised, and selected bit line's currents are supplied to the input nodes IN and /IN of the sense amp.

At this time, in accordance with the difference between an injection current carried from the selected cell and another injection current carried from the reference cell, a drain voltage difference is generated on the drains of NMOS transistors M6 and M7, each operation point of which moves from a linear characteristic region to a current saturation region. The voltage difference will be amplified by NMOS transistors M4 and M5, and latched.

That is, the cell current difference is converted to a voltage difference in such a manner that when transistors M6 and M7 are turned on with /SE, the "timing difference" of transition timings from the linear characteristic region to the current saturation region thereof becomes a "voltage difference" of these drains, and this drain voltage difference becomes a "gate voltage difference" between one common gate of M2 and M4 and the other common gate M3 and M5, thereby turning off one of PMOS transistors M0 and M1.

Setting the common gate to be low, for example VRR, at the beginning of the sense operation, the transistor pair of M10 and M11 serves for squeezing the sense amp current carried from Vdd in a low conductance state defined by the control signal vLTC. With this function, the cell current supplied via transistor pair of M12 and M13 will be reflected sufficiently on the sense amp state.

After the sense amp balance breaks definitely as a result of the initial sensing of the current difference, as shown in FIG. 31, gate signal vLTC is changed from VRR to VPP higher than Vdd so that the power supply voltage Vdd is applied to the sense amp. As a result, the output voltage fully swings to Vdd. Then the signal ACC is lowered, and the cell current supplied to the sense amp is cut off.

Since the characteristic variation of shrunk pair transistors occur due to the fluctuation of the fabrication processes, considering that the current path is formed of as many elements connected in series as possible, the variation will be effectively cancelled. Therefore, M0-M1 pair, M8-M9 pair and M10-M11 pair are inserted between the input nodes and the power supply node Vdd.

Specifically, NMOS transistor pair of M10 and M11 functions to suppress the influence of variations of PMOS transistor pairs M0-M1 and M8-M9, which form a feed back loop of the sense amp operation. That is, suppressing the conductance of NMOS transistors, the drain and source voltages of PMOS transistors are raised so that the conductance of these PMOS transistors is made to be higher. These conductance values of NMOS transistors and PMOS transistors function to suppress the influence of variations thereof.

NMOS transistor pair of M10 and M11 are driven in such a way that the gate control signal vLTC is set to be low at the beginning and high at the latter half time so that it functions to increase the amplifying function at the signal amplifying time and latch the decided data at a high speed with a high conductance after data sensing.

Time difference "T" between the rising time of signal ACC and the falling time of sense-starting signal /SE will be set suitably in such a way as to start sensing after the cell current injection, which is performed with the signal ACC raised, ends and after a certain waiting time until the cell current is reflected sufficiently to the input current.

Figure 32:
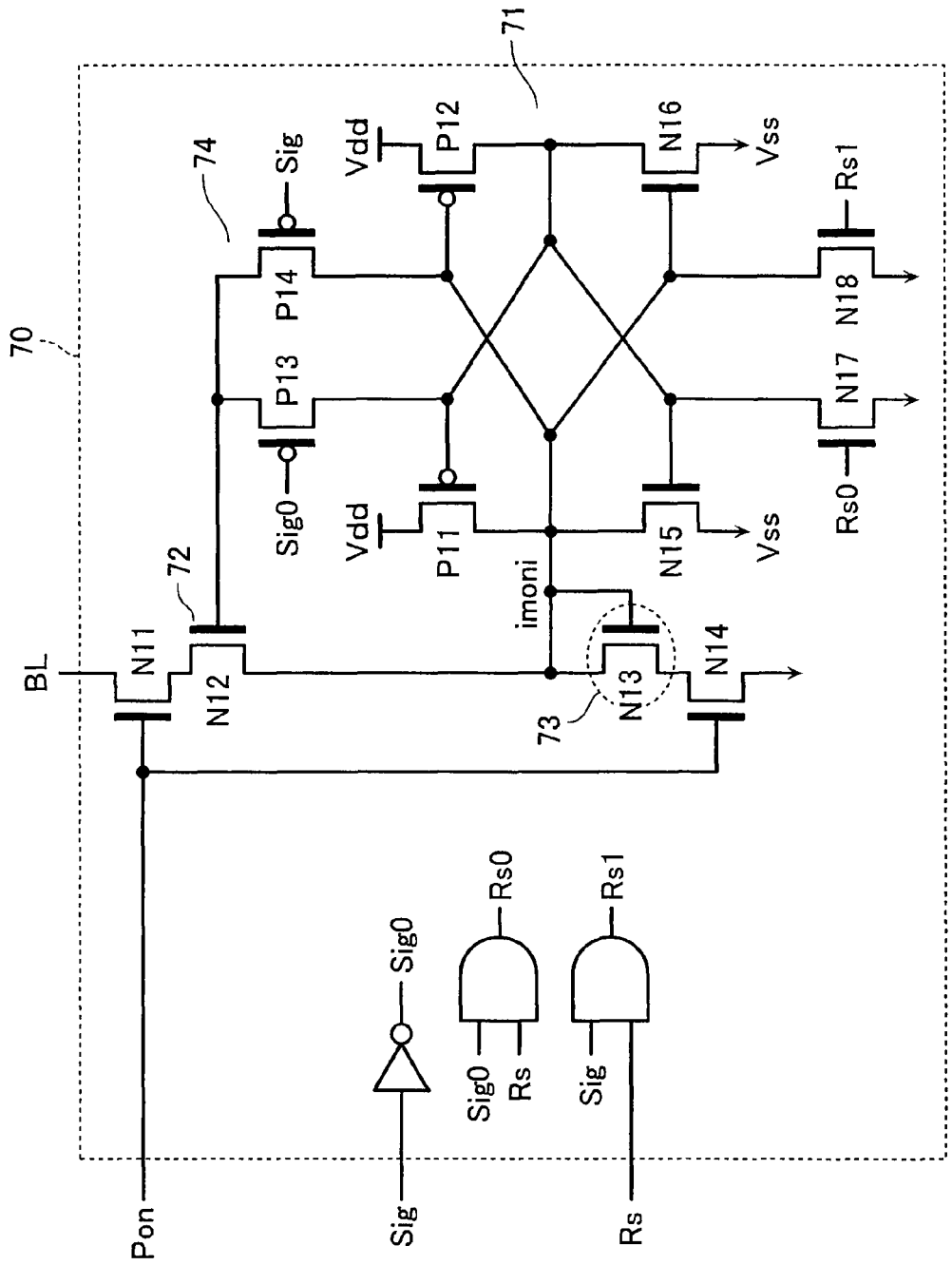
FIG. 32 shows the current cutter circuit attached to the sense amplifier.

FIG. 32 shows a current cutter circuit 70, which is attached to the sense amplifier 60. Current cutter 70 is coupled to the selected bit line at a write or program time and used for controlling the data programming. In detail, current cutter 70 detects program completion based on the cell current change on the selected bit line in accordance with write cell's data, and cuts off the bit line current. It is assumed here that the variable resistance element VR is formed of such a material system defined by the following properties: a high resistance state (e.g., data "0") is a stable state; apply voltage to the high resistance cell, and a low resistance state (e.g., data "1") is obtained; and apply Joule's heat to the low resistance cell by the cell current, and the high resistance state (data "0") is restored.

This current cutter circuit shown in FIG. 32 includes: state transition circuit 71, the initial state of which is set in accordance with the program information of memory cell; current monitor device 73 formed of diode-connected NMOS transistor N13 for detecting cell current changed in accordance with resistance change of the memory cell; and switch device 72 formed of NMOS transistor N12, which serves for cutting the cell current in accordance with the state change of the state transition circuit 71 detected by the monitor device 73.

The state transition circuit 71 is a flip-flop. Disposed between two nodes of the flip-flop and the gate of NMOS transistor N12 is a switch circuit 74 with PMOS transistors P13 and P14, which serves for turning on the NMOS transistor N12 at an initial state of both of "1" write and "0" write, and turning off it on receipt of the state transition at the write completion time.

A current path formed of switch device 72 and current monitor device 73, which are serially coupled to a memory cell to be programmed, is separated from the memory cell before the program starting with NMOS transistors N11 and N14, which are driven by start signal "Pon". Note here that the flip-flop is so designed in size as to take in a small current, and apply little influences to the cell current of the variable resistance element of the memory cell.

To set the initial state in the flip-flop, apply signals "Rs0" and "Rs1" to reset NMOS transistors N17 and N18, respectively. These signals are generated synchronously with a reset signal "Rs" in accordance with signal "Sig" and the inverted signal "Sig0". That is, NMOS transistor N15 of the flip-flop 71 is turned off in accordance with "Rs0", current monitor node "imoni" is set at "H". In accordance with signal "Rs1", the reversed state will be set.

The gates of PMOS transistors P13 and P14 in the switch circuit 74 are driven by "Sig0" and "Sig", respectively. With this switch circuit 74, the gate of NMOS transistor N12 is coupled to one node set as "H" in the flip-flop 71 and turned on without regard to the initial state of the flip-flop.

After initializing the flip-flop in accordance with data to be programmed, the program start signal "Pon" becomes "H" for starting the program of the variable resistance element of the memory cell, so that the bit line BL of the memory cell array is coupled to this current cutter circuit.

The cell current in the memory cell flows through the switch device 72 to the node "imoni", and successively flows through the current monitor device 73, which is formed of diode-connected NMOS transistor N13 (or another transistor with the gate set at level Vref for limiting the device current), to be discharged to Vss. Therefore, the node "imoni" is set in level in accordance with cell current. In detail, when the node "imoni" is over a level, the state of flip-flop is changed, and switch device 72 is turned off to cut the cell current.

FIG. 33 shows the relationships between cell state "0" (high resistance state) to be programmed and cell state "1" (low resistance state), in which initial states and program completion states are shown with respect to the monitor node "imoni" and switch device 72.

At a "0" program time, the initial state is imoni="H", and switch device 72 is driven through PMOS transistor P13 to be on. If the cell state before programming is "1", a large cell current flows to the monitor node "imoni" and keeps level thereof. Soon, as the memory cell becomes a high resistance state with Joule's heat, the cell current decreases to make the monitor node "imoni" low. As a result, the flip-flop is inverted from the initial state, and this makes the switch device 72 off.

If the cell is in a "0" state before programming, the monitor node "imoni" becomes "H" simultaneously with the start of programming, and this makes soon the switch device 72 off.

At a "1" program time, the initial state is imoni="L", and switch device 72 is driven through PMOS transistor P14 to be on. If the cell state before programming is "0", a small cell current flows to the monitor node "imoni" and keeps level thereof. Soon, as the memory cell becomes a low resistance state with voltage applied, the cell current increases to make the monitor node "imoni" high. As a result, the flip-flop is inverted from the initial state, and this makes the switch device 72 off.

If the cell is in a "1" state before programming, the monitor node "imoni" becomes "H" simultaneously with the start of programming, and this makes soon the switch device 72 off.

Next, a defect relieving system serving for replacing a bad standby unit with a spare standby unit will be explained with reference to FIG. 34. The spare standby unit will be simply referred to as "spare unit" hereinafter.

Figure 34:
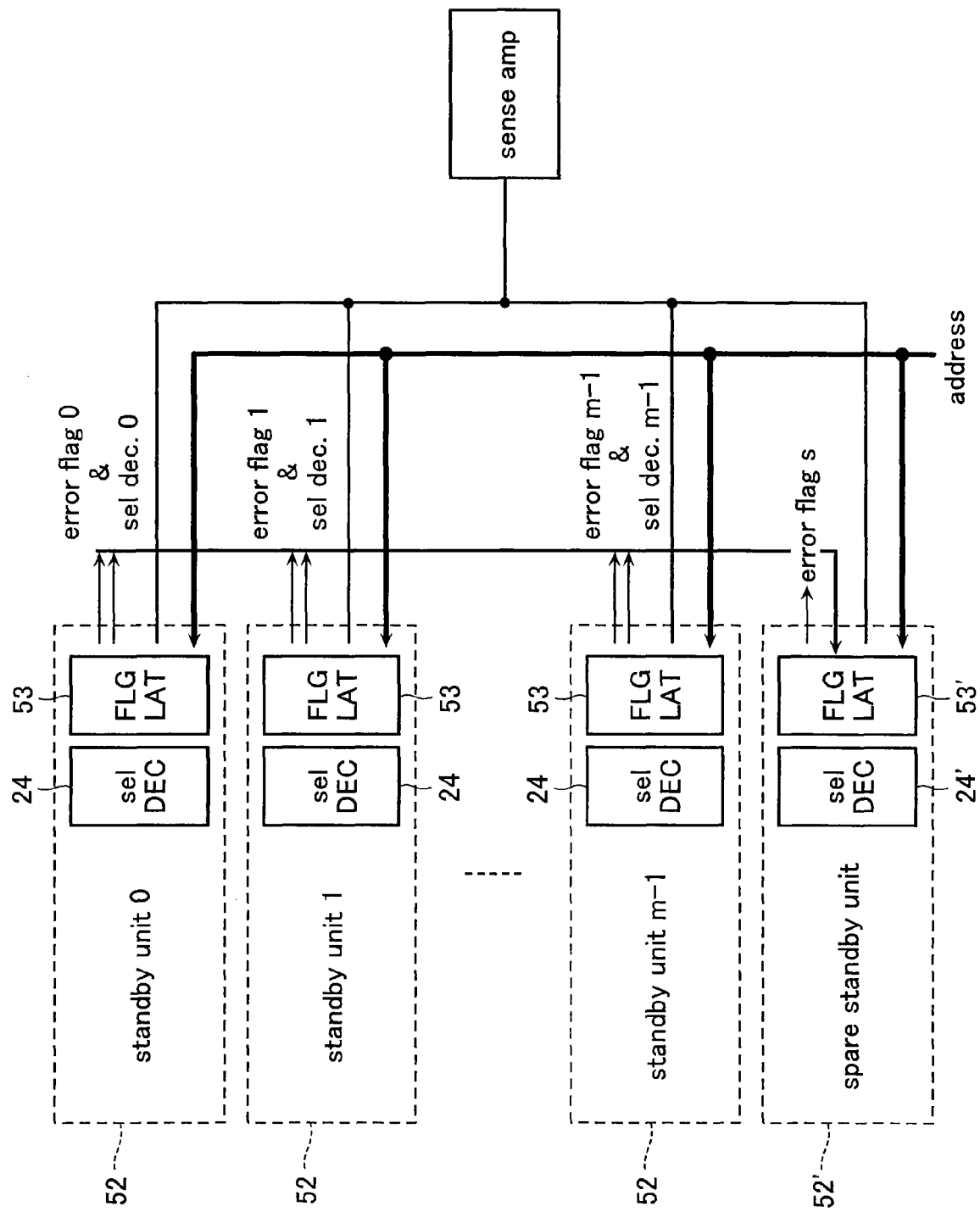
FIG. 34 shows a bad unit replacement system with a spare unit.

As shown in FIG. 34, multiple standby units 52 and a spare unit 52' with the same configuration as the standby unit 52 are prepared for one sense amplifier system. Each standby unit 52 has, as described above, bit line select circuit 24 and bad flag holding circuit 53. Spare unit 52' also has bit line select circuit 24' and bad flag holding circuit 53' as well as the standby unit.

In case one of the standby units 52 includes a bad cell, it is automatically replaced with spare unit 52'. In case there are two or more bad standby units, the above-described replacement is not performed. In case the spare unit 52' itself is bad, it is not replaced with others.

The states of the standby units are judged based on the bad flags or error flags. In case of "m" standby units 52, "m" error flags, "error flag 0"~" error flag m–1", are input to the bit line select circuit 24' in the spare unit 52' to be subjected to defect detection. In case the spare unit 52' is used in place of a bad standby unit, it is in need of keeping the bit line selection situation in the bad standby unit. For this purpose, selection signal, "sel dec. j (j=0, . . . , m–1)" is also supplied to the bit line selection circuit 24' in the spare unit 52' from the bad standby unit.

The logic of the selection circuit 24' is as follows: when error flag "error flag s" of the spare unit 52' is "0" (normal) and one of error flags, "error flag 0~error flag m–1" in the standby units is "1" (bad), the spare unit 52' is activated to restore the bit line selection state set in the replaced standby unit.

Figure 35:
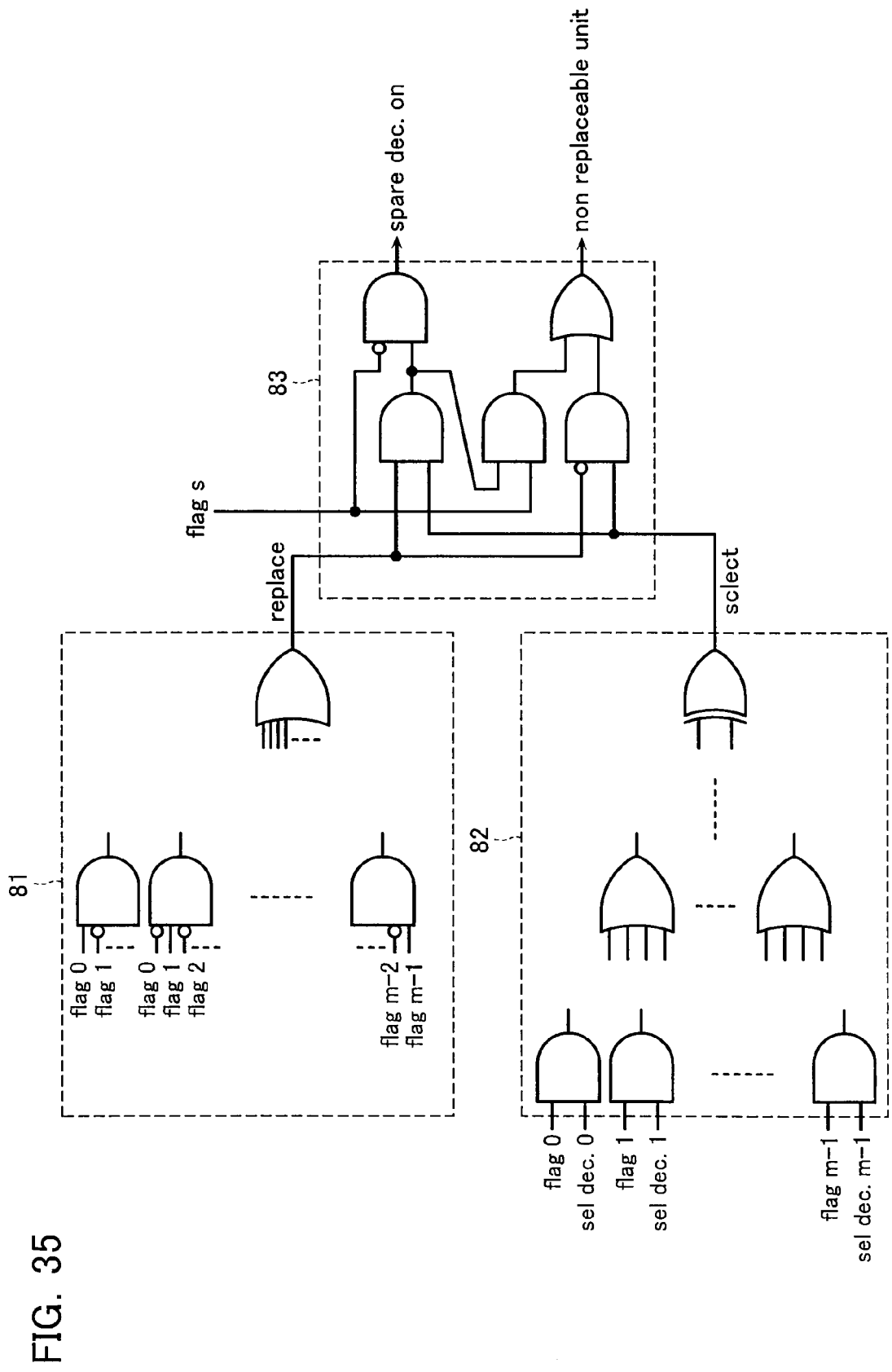
FIG. 35 shows a replacement signal generating circuit of the bad standby unit.

FIG. 35 shows a detailed logic circuit used in the bit line selection circuit 24' in the spare unit 52'. Replace signal generating circuit 81 has a set of AND circuits for detecting only one of error flags "error flag 0~error flag m–1" in the standby units is "1", and outputting a replace signal "replace". In detail, error flags of the whole standby units are input to the AND gates, and resultants thereof are input to an OR gate. With this logic process, the replace signal "replace" will be generated. That is, replace="1" designates that only one standby unit is bad.

The error flag is for only indicating that there is a bad, and does not contain the information of whether the standby unit is accessed or not. Therefore, to generate a selection signal "select" based on the error flags "error flag 0~error flag m–1" and the selection signal "sel dec. 0~sel dec. m–1" for designating that the standby unit is accessed, select gate circuit 82 is prepared.

In the select gate circuit 82, the respective error flags "error flag" and selection signals "sel dec." are input to AND gates, and the resultants are successively subjected to OR logics, so that the select signal "select" is generated.

Replacement judging circuit 83 is prepared for generating a replacing signal "spare dec. on" in such a case that the bad flag "flag s" in the spare unit is "0"; and both of replace signal "replace" and select signal "select" are "1". In case the spare unit is bad even if there is one bad standby unit (i.e., flag s="1"), and in case two or more standby units are bad (i.e., replace="0" and select="1"), signal "non replaceable unit" will be generated for designating that there are bad standby units to be not replaceable.

Figure 36:
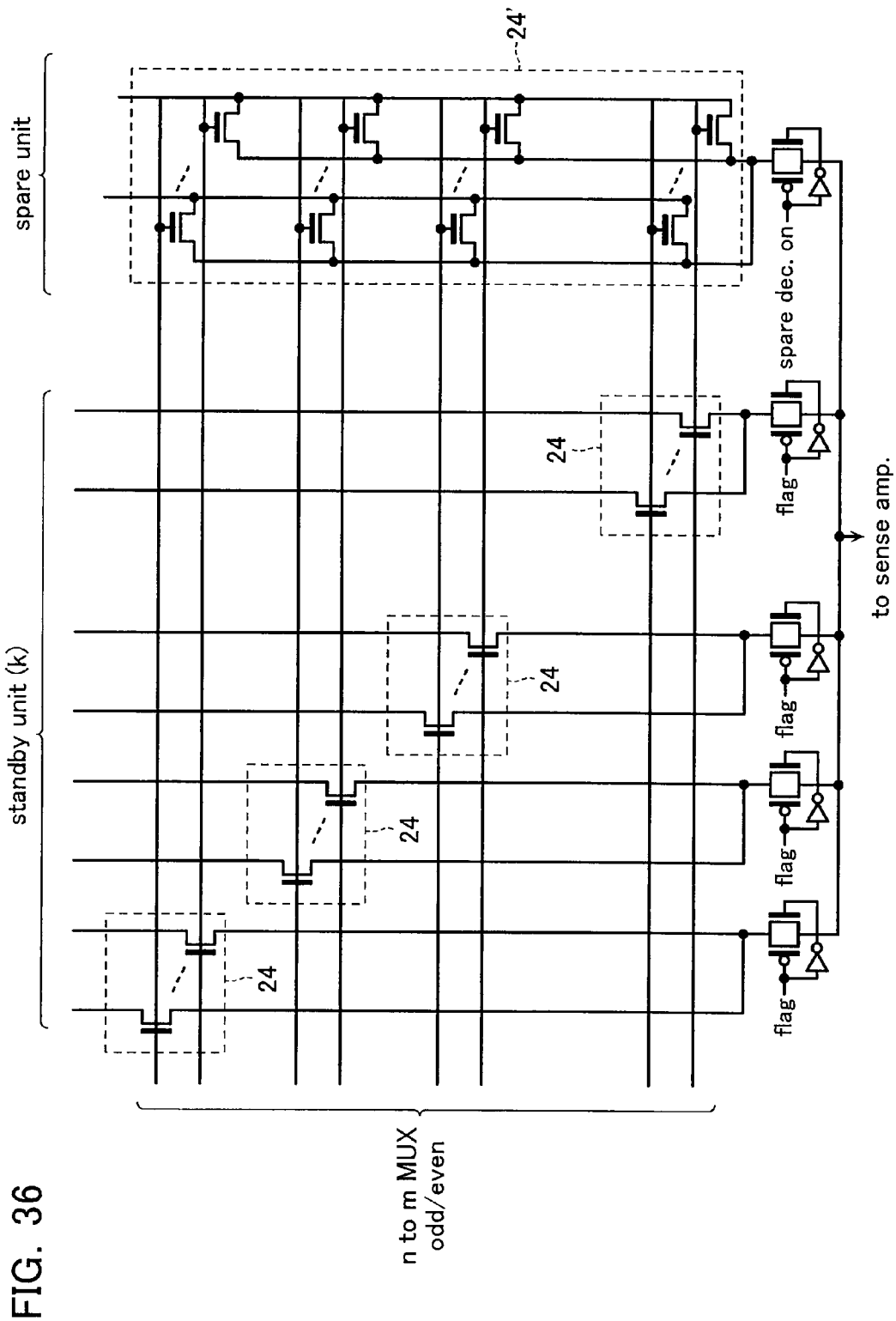
FIG. 36 shows a circuit system used for copying bit line selecting situation in a bad standby unit to the spare unit.

FIG. 36 shows a copying circuit for transferring the bit line selection state in the standby unit 52 to the spare unit 52' when the standby unit 52 is replaced with the spare unit 52'. In FIG. 36, there are transistor circuits constituting the selection circuits 24 in the standby units 52 and another transistor circuit constituting the selection circuit 24' in the spare unit 52', into which the bit line selection state defined by the selection circuits 24 is copied.

Supplied to n/m gate signal wirings coupled to the respective gates of select transistors in the selection circuits 24 are decoded select signal "n to m MUX odd" or "n to m MUX even". If the number of standby units is "k", every "n/mk" selecting wirings are coupled to the respective standby units for selecting them. In the respective standby units, current paths to be coupled to the sense amplifier will be formed in accordance with the error flag "flag".

In the spare unit, there are prepared OR gates, each of which includes "k" transistors for selecting one of bit lines. Each OR gate is formed of the selecting wirings selected one by one without multiplication from the respective standby units. In the example shown in FIG. 36, to clearly show the relationship between the corresponding bit lines, select transistors in the standby units are selected in order from the left side and the corresponding OR gates are formed in the spare unit.

As a result, even if which bit line is selected in the standby units, the corresponding bit line may be selected in the spare unit. Therefore, when an error flag "flag" is generated from a standby unit, which is separated from the sense amplifier, and replace signal "spare dec. on" is generated, the spare unit serves as a replaced standby unit.

It is assumed in the above-described example that the replacement signal "spare dec. on" is automatically generated in the standby unit in accordance with the error flag and the like. By contrast, it is possible to use such a replacement circuit monitors the flag signals output from the standby units and select one of bad standby units, thereby generating a replacement signal "spare dec. on" based on the selection state. The above-described replacement circuit may be formed to have a ROM fuse circuit for storing the replacement of the bad standby units with fuse devices as well as the conventional redundancy system.

Figure 37:
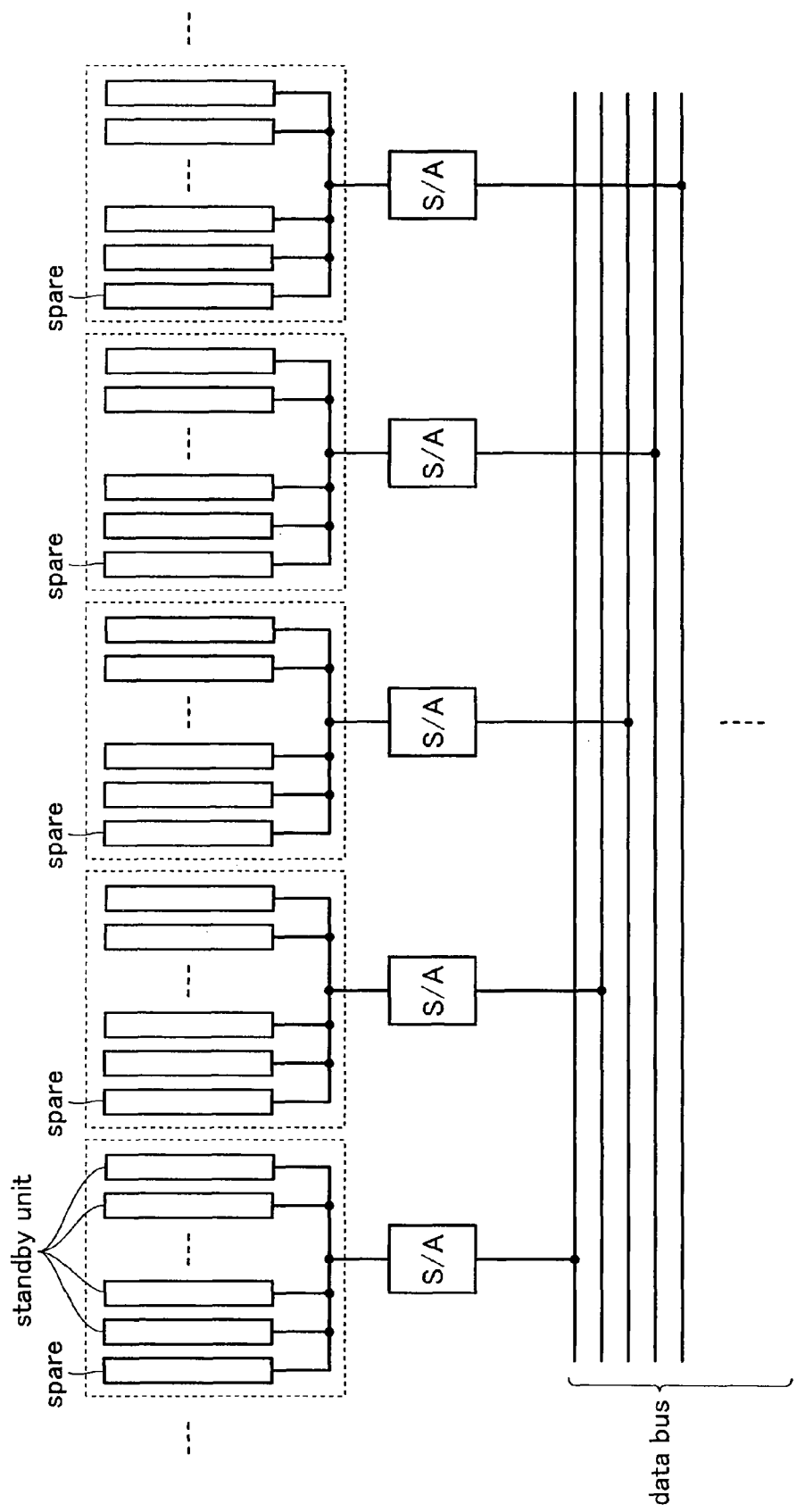
FIG. 37 shows a memory system with multiple memory blocks.

FIG. 37 shows a memory system, which includes multiple memory blocks arranged, and each memory block is formed of multiple standby units and one spare unit. Sense amplifiers S/A are prepared in one-to-one correspondence to the memory blocks, and the respective sense amplifiers are coupled to different data lines in the data bus. This memory system is formed in such a manner that one memory block corresponds to one bit, and dealt with such a system that bit data corresponding to the number of memory blocks are simultaneously read or written.

The above-described embodiment will be summarized as follows:

(1) A resistance change memory device including: a memory cell array, which has a plurality of first wirings, a plurality of second wirings so disposed as to cross the first wirings, and memory cells disposed at the cross points of the first and second wirings, each of the memory cells including a diode and a variable resistance element connected in series, the diode being disposed with such a polarity that anode thereof is located on the first wiring side, wherein the memory cell array is sequentially set in the following three states after power-on: a waiting state defined by that both the first and second wirings are set at a first voltage; a standby state defined by that the first wirings are kept at the first voltage and the second wirings are set at a second voltage higher than the first voltage; and an access state defined by that a selected first wiring is set at a third voltage higher than the first voltage and a selected second wiring is set at the first voltage, a selected memory cell being read or written in the access state.

(2) The resistance change memory device defined in (1), wherein a defect detection operation is performed in the standby state of the memory cell array in such a way as to detect a defective wiring based on cell current of a defective cell with a degraded diode coupled to the defective second wiring, and set the defective wiring in a floating and unused state.

(3) The resistance change memory device defined in (1), further including:

a defect detection circuit configured to detect a defective second wiring in the memory cell array in the standby state based on cell current of a defective cell with a degraded diode coupled to the defective second wiring, and set the defective second wiring in a floating and unused state.

(4) The resistance change memory device defined in (1), wherein the memory cell array is divided into a plurality of units each defined as a range including a plurality of the wirings, and further including:

defect detection circuits prepared for the respective units so as to detect a defective wiring, to which a defective cell with a degraded diode is coupled, and set the defective wiring in a floating and unused state.

(5) The resistance change memory device defined in (4), further including:

power supply circuits prepared for the respective units for setting the second wirings at the second voltage in the standby state; and switch circuits prepared for the respective units for coupling selected ones in the second wirings to the corresponding sense amplifiers.

(6) The resistance change memory device defined in (5), wherein the defect detection circuit includes a latch circuit, which is reset in the waiting state and detects the voltage drop of the second wiring so as to generate and latch an error flag, and wherein the corresponding ones are off-driven by the error flag.

(7) The resistance change memory device defined in (4), wherein the memory cell array includes a spare unit to be accessed in place of defective one in the units in accordance with the defect detection circuit.

(8) The resistance change memory device defined in (1), wherein the memory cell array is formed of multiple layers stacked.

(9) The resistance change memory device defined in (1), further including:

a current cutter circuit configured to be coupled to selected one of the second wirings in the memory cell array in a program mode, and monitor cell current to detect program completion, thereby cutting the cell current.

(10) A resistance change memory device including:

a memory cell array, which has a plurality of first wirings, a plurality of second wirings so disposed as to cross the first wirings, and memory cells disposed at the cross points of the first and second wirings, the memory cell including a diode and a variable resistance element connected in series, the diode being disposed with such a polarity that anode thereof is located on the first wiring side; and a defect detection circuit configured to detect a defective second wiring, to which a defective cell with a degraded diode is coupled, in such a standby state of the memory cell array that the diodes of the memory cells are reverse-biased, and set the defective second wiring in a floating and unused state.

(11) The resistance change memory device defined in (10), wherein the memory cell array is sequentially set in the following three states after power-on: a waiting state defined by that both the first and second wirings are set at a first voltage; the standby state defined by that the first wirings are kept at the first voltage and the second wirings are set at a second voltage higher than the first voltage; and an access state defined by that a selected first wiring and a selected second wiring are set at a third voltage higher than the first voltage and the first voltage, respectively, a selected memory cell being read or written in the access state.

(12) The resistance change memory device defined in (10), wherein the memory cell array is divided into a plurality of units each defined as a range including a plurality of the second wirings, and wherein a plurality of the defect detection circuits are prepared for the respective units.

(13) The resistance change memory device defined in (12), further including:

power supply circuits prepared for the respective units for setting the second wirings at the second voltage in the standby state; and switch circuits prepared for the respective units for coupling selected ones in the second wirings to the corresponding sense amplifiers.

(14) The resistance change memory device defined in (12), wherein the defect detection circuit includes a latch circuit, which is reset in the waiting state and detects the voltage drop of the second wiring so as to generate and latch an error flag, and wherein the corresponding ones in the power supply circuits and the switch circuits are off-driven by the error flag.

(15) The resistance change memory device defined in (12), wherein the memory cell array includes a spare unit to be accessed in place of defective one of the units in accordance with the defect detection circuit.

(16) The resistance change memory device defined in (10), wherein the memory cell array is formed of multiple layers stacked.

(17) The resistance change memory device defined in (10), further including:

a current cutter circuit configured to be coupled to selected one of the second wirings in the memory cell array in a program mode, and monitor cell current to detect program completion, thereby cutting the cell current.

This invention is not limited to the above-described embodiment. It will be understood by those skilled in the art that various changes in form and detail may be made without departing from the spirit, scope, and teaching of the invention.

What is claimed is:

1. A resistance change memory device comprising: a memory cell array, which includes a plurality of first wirings, a plurality of second wirings so disposed as to cross the first wirings, and memory cells disposed at the cross points of the first and second wirings, each of the memory cells including a diode and a variable resistance element connected in series, the diode being disposed with such a polarity that anode thereof is located on the first wiring side, wherein
the memory cell array is sequentially set in the following three states after power-on: a waiting state defined by that both the first and second wirings are set at a first voltage; a standby state defined by that the first wirings are kept at the first voltage and the second wirings are set at a second voltage higher than the first voltage; and an access state defined by that a selected first wiring is set at a third voltage higher than the first voltage and a selected second wiring is set at the first voltage, a selected memory cell being read or written in the access state.

2. The resistance change memory device according to claim 1, wherein
a defect detection operation is performed in the standby state of the memory cell array in such a way as to detect a defective wiring based on cell current of a defective cell with a degraded diode coupled to the defective wiring, and set the defective wiring in a floating and unused state.

3. The resistance change memory device according to claim 1, further comprising:
a defect detection circuit configured to detect a defective second wiring in the memory cell array in the standby state based on cell current of a defective cell with a degraded diode coupled to the defective second wiring, and set the defective second wiring in a floating and unused state.

4. The resistance change memory device according to claim 1, wherein
the memory cell array is divided into a plurality of units each defined as a range including a plurality of the wirings, and further comprising:
defect detection circuits prepared for the respective units so as to detect a defective wiring, to which a defective cell with a degraded diode is coupled, and set the defective wiring in a floating and unused state.

5. The resistance change memory device according to claim 4, further comprising:
power supply circuits prepared for the respective units for setting the second wirings at the second voltage in the standby state; and
switch circuits prepared for the respective units for coupling selected ones in the second wirings to corresponding sense amplifiers.

6. The resistance change memory device according to claim 5, wherein
the defect detection circuit includes a latch circuit, which is reset in the waiting state and detects the voltage drop of the second wiring so as to generate and latch an error flag, and wherein
corresponding ones are off-driven by the error flag.

7. The resistance change memory device according to claim 4, wherein
the memory cell array includes a spare unit to be accessed in place of defective one in the units in accordance with the defect detection circuit.

8. The resistance change memory device according to claim 1, wherein
the memory cell array is formed of multiple layers stacked.

9. The resistance change memory device according to claim 1, further comprising:
a current cutter circuit configured to be coupled to selected one of the second wirings in the memory cell array in a program mode, and monitor cell current to detect program completion, thereby cutting the cell current.

* * * * *